(12) United States Patent
Ito

(10) Patent No.: US 11,417,385 B1
(45) Date of Patent: Aug. 16, 2022

(54) SEMICONDUCTOR MEMORY APPARATUS

(71) Applicant: Winbond Electronics Corp., Taichung (TW)

(72) Inventor: Yutaka Ito, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/227,393

(22) Filed: Apr. 12, 2021

(51) Int. Cl.
G11C 11/406 (2006.01)

(52) U.S. Cl.
CPC .............................. G11C 11/40626 (2013.01)

(58) Field of Classification Search
CPC ................................................ G11C 11/40626
USPC ........................................................ 365/149
See application file for complete search history.

(56) References Cited

U.S. PATENT DOCUMENTS

| 2005/0248755 | A1 | 11/2005 | Chou et al. | |
|---|---|---|---|---|
| 2020/0082873 | A1 | 3/2020 | Wolff | |
| 2020/0402568 | A1* | 12/2020 | He | G11C 11/40626 |
| 2020/0402569 | A1* | 12/2020 | He | G11C 11/40626 |

FOREIGN PATENT DOCUMENTS

| CN | 109961815 | 7/2019 |
|---|---|---|
| JP | 2015092423 | 5/2015 |
| JP | 2017182854 | 10/2017 |
| KR | 20190128890 | 11/2019 |
| TW | 529025 | 4/2003 |
| TW | 200423131 | 11/2004 |
| TW | I680457 | 12/2019 |

OTHER PUBLICATIONS

Kim et al., "Flipping Bits in Memory Without Accessing Them: An Experimental Study of DRAM Disturbance Errors", 2014 ACM/IEEE 41st International Symposium on Computer Architecture (ISCA), Jun. 14-18, 2014, pp. 1-12.
Office Action of Korea Counterpart Application, with English translation thereof, dated Feb. 25, 2022, pp. 1-6.
"Office Action of Taiwan Counterpart Application", dated Apr. 18, 2022, p. 1-p. 6.

* cited by examiner

Primary Examiner — Anthan Tran
(74) Attorney, Agent, or Firm — JCIPRNET

(57) ABSTRACT

A semiconductor memory apparatus is provided. The semiconductor memory apparatus includes a temperature sensor, a plurality of memory blocks and a refresh controller. The temperature sensor detects a device temperature inside the semiconductor memory apparatus to generate a corresponding temperature signal. Each of the memory blocks includes a memory cell array having a plurality of volatile memory cells, and a plurality of word lines. The refresh controller monitors accesses to the word lines, detects accesses that occur a predetermined number of times within a predetermined period, and assigns a refresh operation corresponding to the refresh operation command to a first refresh operation or a second refresh operation.

16 Claims, 19 Drawing Sheets

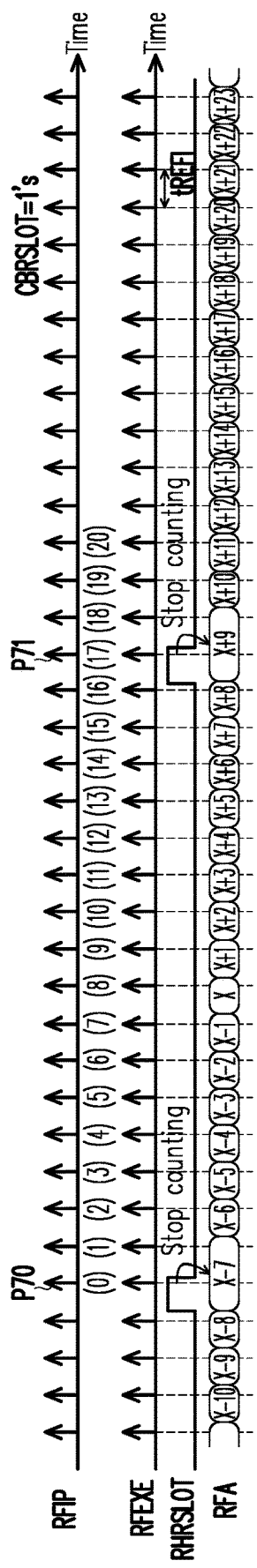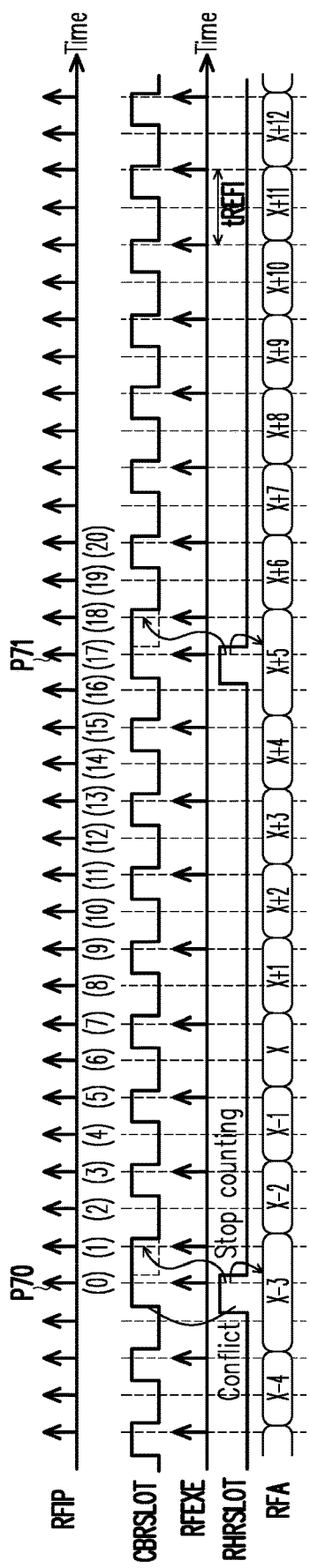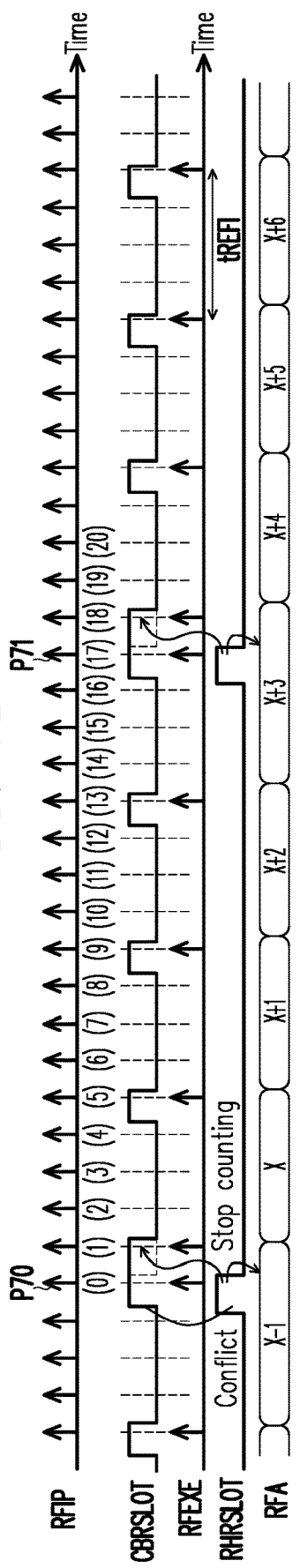
FIG. 7A
FIG. 7B
FIG. 7C

SEMICONDUCTOR MEMORY APPARATUS

BACKGROUND

Technical Field

The disclosure relates to an electronic apparatus, and particularly relates to a refresh control method for a semiconductor memory apparatus having memory cells that require refresh operations to retain data, and a semiconductor memory apparatus using the refresh control method.

Description of Related Art

Dynamic random access memories (DRAM) of semiconductor memory apparatuses have become even more sophisticated as the development of process technology progresses, and the row hammer effect has become obvious, since a number of times of enabling/disabling a word line until an error occurs, i.e., a hammer threshold, has been less than 100,000 in a 20 nm manufacturing process. If there is no circuit countermeasure in the DRAM or some countermeasures on a memory system side, it is difficult to maintain a normal operation.

In a circuit countermeasure in the DRAM, for example, a row hammer refresh (RHR) is widely used to capture a row address (a hammer address) that is frequently accessed and perform an additional refresh operation on an adjacent row address at an appropriate frequency. There are roughly two methods for capturing the hammer address. One method focuses on an increased occurrence times (access times), and the other focuses on a naturally risen occurrence frequency (occurrence probability).

However, in order to maintain necessary data retention characteristics, a refresh cycle is shortened, and an effective refresh cycle is also shortened, which easily improves the effect of row hammer refresh at the same time, but this also indicates that the amount of data refreshed in one refresh operation (a number of memory cells) and the number of enabled word lines are further increased, meaning that a refresh current (idd5) may increase significantly.

Regarding the countermeasure to mitigate the above situation, it is known that temperature compensated refresh (TCR) is adopted in recent mobile DRAMs (for example, LPDDR4, etc.), such that along with the decrease of temperature, an obvious cell leakage factor is greatly decreased. Therefore, it is emphasized that the refresh cycle may be extended, and a control device side that controls the DRAM extends a sending interval of an automatic refresh command to, for example, twice or four times. In this way, the refresh current is reduced in an actual use.

However, at low temperatures, a ratio of assigning the automatic refresh command to the row hammer refresh is increased, and it is hard to balance the row hammer refresh and other regular refreshes (such as CBR (CAS before RAS) refresh), and the risk of data retention increases.

After entering the generation of 1αnm, due to the significant reduction of the hammer threshold, most refresh operations at low temperatures must be assigned to the row hammer refresh. In a temperature compensation refresh used in the mobile DRAM, it will be difficult to maintain data retention capability of products and reduction of refresh current at the same time in the future.

SUMMARY

The disclosure is directed to a semiconductor memory apparatus, which is adapted to appropriately adjust execution cycles of CBR refresh and row hammer refresh in all temperature ranges, so as to obtain necessary and sufficient data retention capability and reduce power consumption.

The disclosure provides a semiconductor memory apparatus including a temperature sensor, a plurality of memory blocks and a refresh controller. The temperature sensor detects a device temperature inside the semiconductor memory apparatus to generate a corresponding temperature signal. Each of the memory blocks includes a memory cell array having a plurality of volatile memory cells, and a plurality of word lines. The refresh controller monitors accesses to the word lines, detects accesses that occur a predetermined number of times within a predetermined period, and assigns a refresh operation corresponding to a refresh operation command to a first refresh operation or a second refresh operation.

In an embodiment of the disclosure, the first refresh operation is thinned and activated based on information of the device temperature, and the second refresh operation is thinned and activated based on information of an amount of accesses to the word lines. When the first refresh operation and the second refresh operation are in a same cycle, and it is unable to perform two internal refreshes in the same cycle, the refresh controller is adapted to control execution of one refresh operation in the cycle and transfer the unexecuted refresh operation to a next cycle to execute.

Based on the above description, the semiconductor memory apparatus of the disclosure may respectively generate a signal (a first refresh signal) used for performing a CBR refresh operation and a signal (a second refresh signal) used for performing a row hammer refresh operation based on the refresh operation signal. Moreover, in the disclosure, under the premise that necessary and sufficient refresh opportunities are provided in all temperature ranges, the execution cycles of CBR refresh (a first refresh) and row hammer refresh (a second refresh) are appropriately thinned and adjusted. In this way, the data retention capability is ensured, and power consumption is reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 7A to FIG. 7C are schematic diagrams of waveforms of a refresh operation of a semiconductor memory apparatus according to an embodiment of the disclosure.

DESCRIPTION OF THE EMBODIMENTS

Figure 1:
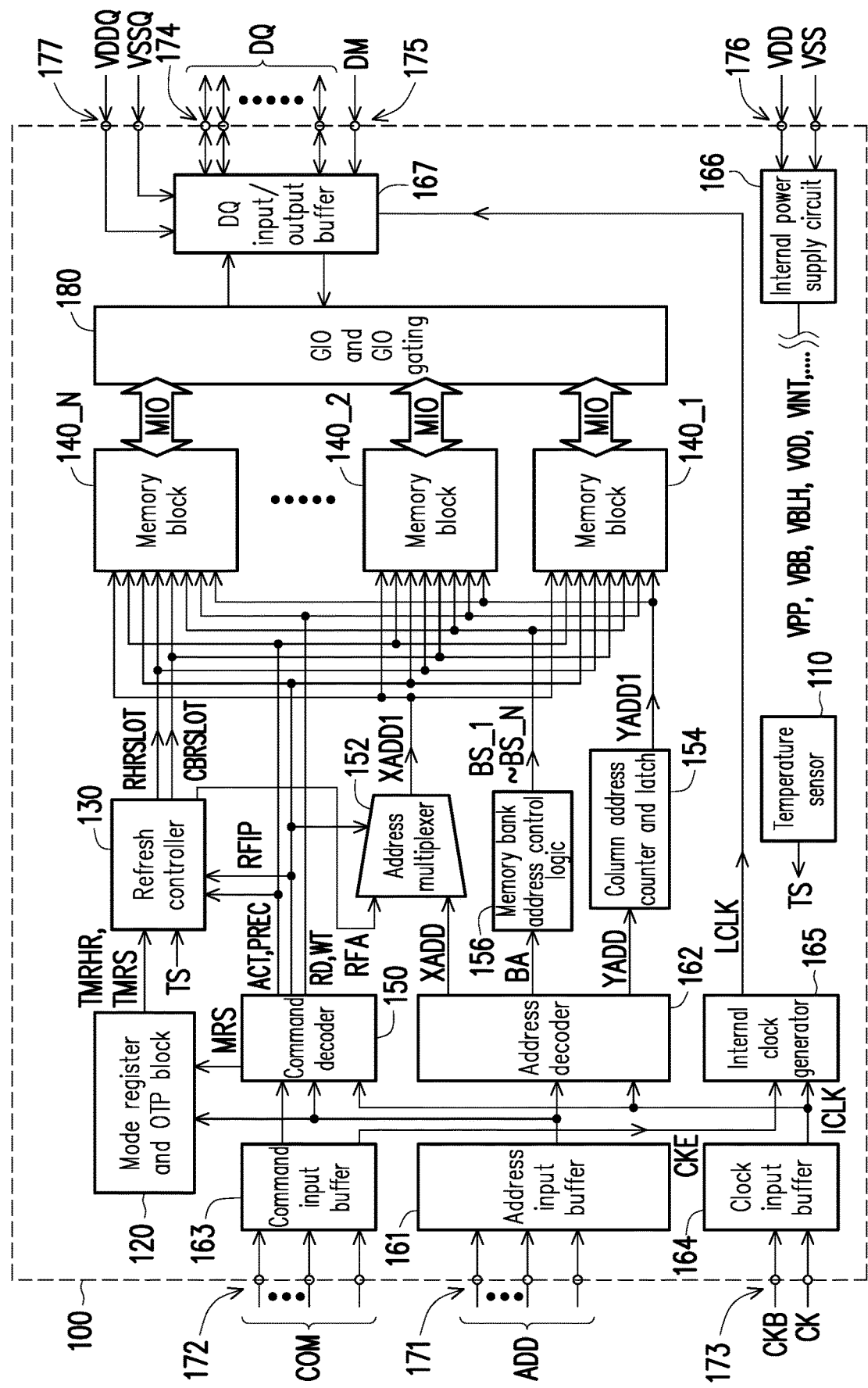
FIG. 1 is a schematic diagram of a semiconductor memory apparatus according to an embodiment of the disclosure.

Referring to FIG. 1 below, FIG. 1 is a schematic diagram of a semiconductor memory apparatus 100 according to an embodiment of the disclosure. The semiconductor memory apparatus 100 includes a temperature sensor 110, a mode register and OTP block 120, a refresh controller 130, memory blocks 140_1 to 140_N, and a command decoder 150, where N is a positive integer greater than 1. In the embodiment, a structure in which one refresh controller 130 controls refresh operations of all of the memory blocks 140_1 to 140_N is adopted.

The temperature sensor 110 is, for example, any type of sensing element/circuit with a temperature detection function. The temperature sensor 110 is adapted to detect a device temperature inside the semiconductor memory apparatus 100 to generate a corresponding temperature signal TS.

The mode register and OTP (one time programmable memory) block 120 is, for example, a circuit composed of a plurality of anti-fuses and a register group referred as mode registers. The anti-fuses store various operation setting information such as a burst length (BL), a CAS waiting time (CL) related to a read operation specification, or first refresh setting information TMRS and second refresh setting information TMRHR related to the disclosure. When a chip is activated, various operation setting information pre-written to the anti-fuses is loaded to the mode registers, and the setting information stored in each mode register is provided to each circuit in the chip. In addition, after the chip is activated, through a mode register setting (MRS) command, based on a MRS signal generated from the command decoder 150 and coding information input from the outside of an address input buffer 161, the operation setting information stored in the mode registers may be reset.

The refresh controller 130 receives the first refresh setting information TMRS and the second refresh setting information TMRHR from the mode register and OTP block 120, receives the temperature signal TS from the temperature sensor 110, and determines an operation specification related to refresh control. In addition, a first refresh signal CBRSLOT and a second refresh signal RHRSLOT may be respectively output based on a refresh operation signal RFIP. The refresh operation signal RFIP is a pulse signal generated by the command decoder 150 when an external command signal COM instructs a refresh command. The refresh controller 130 may adjust an output interval of the first refresh signal CBRSLOT according to the first refresh setting information TMRS and the temperature signal TS, and adjust an output interval of the second refresh signal RHRSLOT according to the second refresh setting information TMRHR and the temperature signal TS. Moreover, the refresh controller 130 may generate a CBR refresh address RFA according to the adjusted first refresh signal CBRSLOT and the second refresh signal RHRSLOT. The first refresh setting information TMRS, for example, represents level information of a CBR refresh skip rate, which is combined with the temperature information TS to determine an activation rate of the first refresh signal CBRSLOT, and implements temperature compensation of the refresh cycle. The second refresh setting information TMRHR, for example, includes a refresh interruption rate and setting information related to row hammer refresh. The so-called refresh interruption rate, for example, represents a ratio of interrupting a second clock RHRCLK and correspondingly changing a logic level of the second refresh signal RHRSLOT. The memory blocks 140_1 to 140_N are coupled to the refresh controller 130. The memory blocks 140_1 to 140_N may perform a first refresh operation in response to the first refresh signal CBRSLOT, and perform a second refresh operation in response to the second refresh signal RHRSLOT. The first refresh operation is, for example, a refresh operation used to perform a CAS before RAS (CBR) refresh, and the second refresh operation is, for example, a refresh operation used to perform a row hammer refresh (RHR). In the embodiment, the first refresh signal CBRSLOT may indicate a period of performing the CBR refresh, and the second refresh signal RHRSLOT may indicate a period of performing the row hammer refresh.

As shown in FIG. 1, the semiconductor memory apparatus 100 further includes an address multiplexer 152, a column address counter and latch 154, a memory bank address control logic 156, an address input buffer 161, an address decoder 162, a command input buffer 163, a clock input buffer 164, an internal clock generator 165, an internal power supply circuit 166, a DQ input/output buffer 167, an address terminal 171, a command terminal 172, a clock terminal 173, a data terminal 174, a data mask terminal 175, a power supply terminal 176, a power supply terminal 177, and a GIO and GIO gating 180.

The address terminal 171 is a terminal for receiving an address signal ADD from the outside. The address signal ADD may be provided to the address decoder 162 through the address input buffer 161. After performing decoding, the address decoder 162 may provide data address XADD to the address multiplexer 152 according to the address signal ADD, provide a column address YADD to the column address counter and latch 154, and provide a block address BA to the memory bank address control logic 156.

The command terminal 172 is a terminal for receiving the command signal COM from the outside. The command signal COM may be provided to the command decoder 150 through the command input buffer 163. The command decoder 150 is a circuit that generates various internal commands by decoding the command signal COM. The internal commands include, for example, an active signal ACT, a pre-charge signal PREC, a read signal RD, a write signal WT, and the refresh operation signal RFIP. The active signal ACT is a pulse signal (an active command) activated when the command signal COM indicates a row access. When the active signal ACT is enabled, a row decoder of a specified memory block address is activated. The pre-charge signal PREC is a pulse signal enabled when the command signal COM indicates pre-charge. When the pre-charge signal PREC is enabled, the row decoder of the specified memory block and a word line specified by the row address controlled by the row decoder are disabled. In addition, when the command signal COM indicates an automatic refresh command, the command decoder 150 may enable the refresh operation signal RFIP.

The address multiplexer 152 is coupled to the refresh controller 130, the command decoder 150, and the address decoder 162. The address multiplexer 152 receives the CBR refresh address RFA and the data address XADD, and selects the CBR refresh address RFA or the data address XADD according to the refresh operation signal RFIP to output as a first row address XADD1. For example, when the refresh operation signal RFIP is in the inactive state, it represents that it is a normal read operation or write operation at this moment, and the address multiplexer 152 may provide the data address XADD (an external input address) as the first row address XADD1. When the refresh operation signal RFIP is in an enabled state, it represents that it is a row hammer operation or a CBR refresh operation at this moment, and the address multiplexer 152 may provide the data address XADD (the external input address) as the first row address XADD1.

The column address counter and latch 154 provides a column address YADD1 according to the column address YADD. The memory bank address control logic 156 provides block selection signals BS_1-BS_N according to the block address BA.

The clock terminal 173 is a terminal for inputting external clock signals CK and CKB. The external clock signal CK and the external clock signal CKB are complementary signals, and both of them are provided to the clock input buffer 164. The clock input buffer 164 generates an internal clock signal ICLK based on the external clock signals CK and CKB in response to a clock enable signal CKE coming from the command input buffer 163, and provides the internal clock signal ICLK to the command decoder 150 and the internal clock generator 165. The internal clock generator 165 may generate an internal clock signal LCLK for controlling an operation timing of the DQ input/output buffer 167 according to the internal clock signal ICLK.

The GIO and GIO gating 180 is coupled to the DQ input/output buffer 167, and is respectively connected to the memory blocks 140_1 to 140_N through a plurality of main input/output lines MIO. The GIO and GIO gating 180 is adapted to read data from a specified memory block to the DQ input/output buffer 167 during a read operation, and write data from the DQ input/output buffer 167 to the specified memory block during a write operation.

The data terminal 174 is a terminal for transmitting input/output data DQ. The data mask terminal 175 is a terminal for receiving a data mask signal DM. When the data mask signal DM is enabled, overwriting of the corresponding data is prohibited. The power supply terminal 176 is a terminal receiving the power supply voltages VDD and VSS, and provides the power supply voltages VDD and VSS to the internal power supply circuit 166. The internal power supply circuit 166 generates various internal potentials VPP, VBB, VBLH, VOD, VINT, etc., based on the power supply voltages VDD and VSS.

The power supply terminal 177 is a terminal for receiving power supply voltages VDDQ and VSSQ, and provides the power supply voltages VDDQ and VSSQ to the input/output circuit 167. The power supply voltages VDDQ and VSSQ respectively have the same potentials as the power supply voltages VDD and VSS supplied to the power supply terminal 176. However, the power supply voltages VDDQ and VSSQ are specially used to the input/output circuit 167, so that a power supply noise generated by the input/output circuit 167 is not propagated to other circuit blocks.

The command decoder 150 is coupled to the refresh controller 130. When the command signal COM indicating the refresh command is received, the command decoder 150 may start to generate the refresh operation signal RFIP. The command decoder 150 may also transmit a mode signal MRS to the mode register and OTP block 120 according to the command signal COM. The mode register and OTP block 120 and the command decoder 150 may all be implemented by logic circuits well known to those skilled in the art in the field of integrated circuits.

Figure 2:
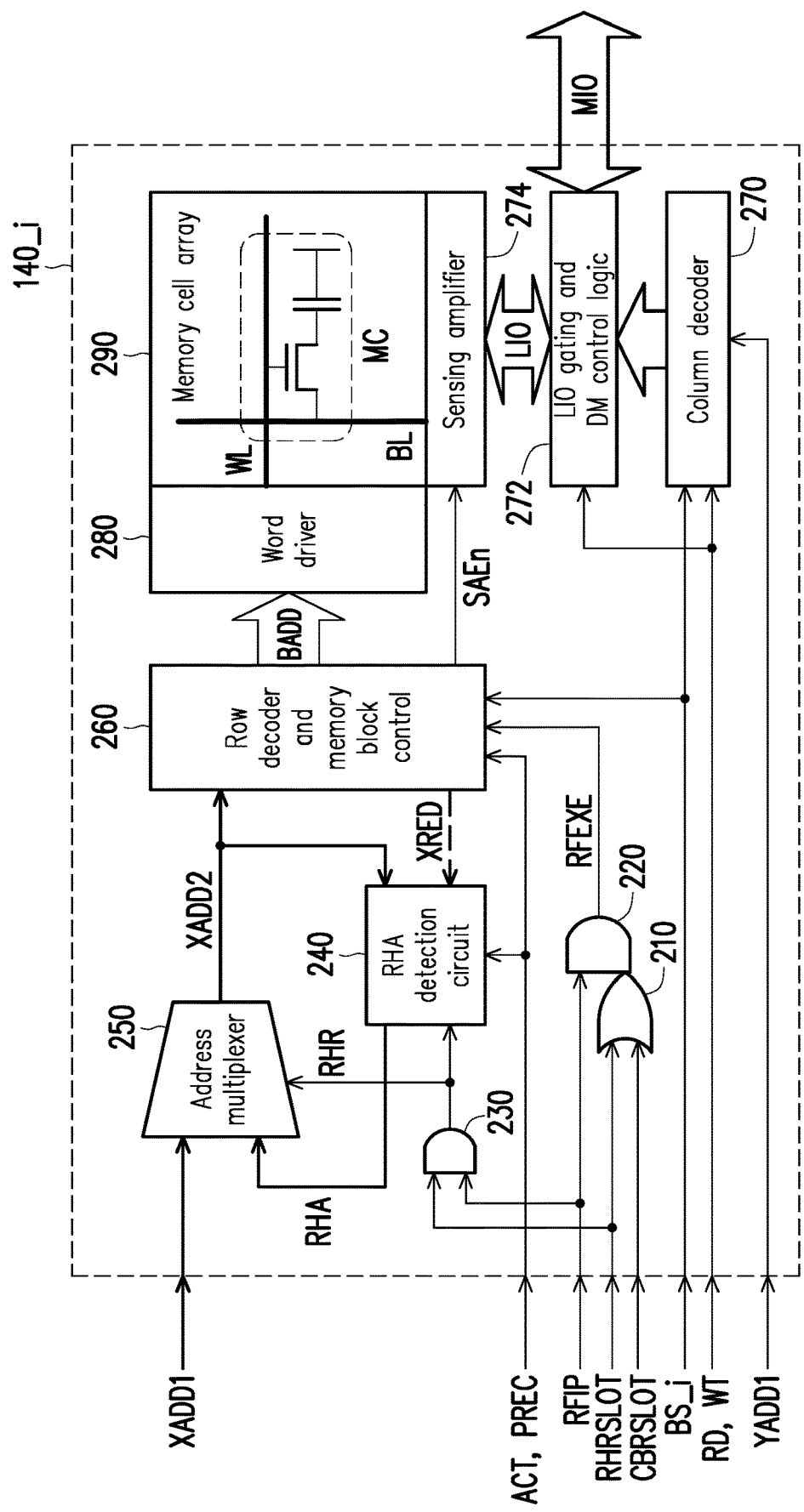
FIG. 2 is a schematic diagram of a memory block according to an embodiment of the disclosure.

An example of a detailed structure of a memory block of the embodiment is described below. FIG. 2 is a schematic diagram of a memory block 140_i according to an embodiment of the disclosure. As shown in FIG. 2, the memory block 140_i includes an OR gate 210, an AND gate 220, an AND gate 230, a row hammer address (RHA) detection circuit 240, an address multiplexer 250, a row decoder and memory block control 260, a column decoder 270, an LIO gating and DM control logic 272, a sensing amplifier 274, a word driver 280, and memory cell array 290. In the embodiment, i is a positive integer, and 1≤i≤N.

A first input terminal of the OR gate 210 is coupled to the first refresh signal CBRSLOT, a second input terminal of the OR gate 210 is coupled to the second refresh signal RHRSLOT. A first input terminal of the AND gate 220 receives the refresh operation signal RFIP, a second input terminal of the AND gate 220 is coupled to an output terminal of the OR gate 210, and an output terminal of the AND gate 220 generates an effective refresh signal RFEXE. The effective refresh signal RFEXE may indicate a refresh operation of automatic refresh that is actually performed, which includes the CBR refresh and the row hammer refresh.

A first input terminal of the AND gate 230 is coupled to the refresh operation signal RFIP, and a second input terminal of the AND gate 230 is coupled to the second refresh signal RHRSLOT. An output terminal of the AND gate 230 generates an enabled (high logic level) row hammer signal RHR when both of the refresh operation signal RFIP and the second refresh signal RHRSLOT are enabled (high logic level).

The RHA detection circuit 240 is coupled to the output terminal of the gate 230. The RHA detection circuit 240 may analyze a second row address XADD2 in response to the active signal ACT, the pre-charge signal PREC and the row hammer signal RHR to generate a row hammer refresh address RHA. To be specific, the RHA detection circuit 240 may monitor current memory cell access operations on the second row address XADD2, and detect the accesses that occur a number of times being greater than or equal to a predetermined number of times within a predetermined period. If the number of times of accesses to the second row address XADD2 is greater than or equal to the predetermined number of times, an address adjacent to the second row address XADD2 is calculated to serve as the row hammer refresh address RHA.

It should be noted that by counting the number of times that the active signal ACT has been enabled, the number of times of accesses to the word line may be obtained. The row hammer refresh address RHA is an address used to perform the row hammer refresh. In the RHA detection circuit 240, a calculation method of the row hammer refresh address RHA may be implemented in the field of integrated circuits by using an application memory circuit framework well known to those skilled in the art.

A first input terminal of the address multiplexer 250 receives the first row address XADD1 from the address multiplexer 152, a second input terminal of the address multiplexer 250 receives the row hammer refresh address RHA, and the address multiplexer 250 selects the first row address XADD1 or the row hammer refresh address RHA as the second row address XADD2 for output according to the row hammer signal RHR.

The row decoder and memory block control 260 is coupled to the RHA detection circuit 240 and the address multiplexer 250. The row decoder and memory block control 260 may be driven according to the active signal ACT and the pre-charge signal PREC, and latches the second row address XADD2 as a block access address BADD for output according to the effective refresh signal RFEXE.

Referring to FIG. 2, when the row hammer signal RHR is equal to a low logic level, it represents that it is not a row hammer refresh operation at this moment, and the address multiplexer 250 may provide the first row address XADD1 coming from the address multiplexer 152 in FIG. 1 as the second row address XADD2. When the row hammer signal RHR is equal to a high logic level, it represents that it is a row hammer refresh operation at this moment, and the address multiplexer 250 may use the row hammer refresh address RHA as the second row address XADD2.

Under the circuit configuration shown in FIG. 2, when the first refresh signal CBRSLOT and the second refresh signal RHRSLOT are output at the same time, the memory block 140_i may perform one of the first refresh operation and the second refresh operation, and perform the unperformed refresh operation in a next refresh cycle. For example, when the second refresh signal RHRSLOT is output, regardless of whether the first refresh signal CBRSLOT is also output at the same time, the row hammer signal RHR output by the AND gate 230 may cause the address multiplexer 250 to select the row hammer refresh address RHA as the second row address XADD2 for output, so as to implement the second refresh operation. Moreover, the unperformed first refresh operation is performed in the next refresh cycle.

The memory cell array 290 has a plurality of word lines WL and a plurality of bit lines BL, and has a configuration that memory cells MC are disposed at intersections of the word lines WL and the bit lines BL. The memory cell array 290 in FIG. 2 shows a structure composed of a word line WL, a bit line BL, and a memory cell MC. In the embodiment, the row decoder and memory block control 260 implements the selection of the word line WL, and the column decoder 270 implements the selection of the bit line BL.

The word driver 280 is adapted to drive the designated word line WL, and the sensing amplifier 274 reads data from the designated memory cell MC or writes data into the designated memory cell MC through the bit line BL.

The LIO gating and DM control logic 272 is connected to the sensing amplifier 274 through a local input/output line LIO. The LIO gating and DM control logic 272 may access the designated memory cell MC through the sensing amplifier 274 according to a decoding result of the column decoder 270. Where, the sensing amplifier 274 may receive stored data of the memory cell MC transmitted through the bit line BL, sense the stored data according to a sensing enable signal SAEn to obtain read data, and send the read data to the main input/output line MIO. The sensing amplifier 274 may also receive written data on the main input/output line MIO, sense the written data according to the sensing enable signal SAEn, and write the sensing result to the memory cell MC through the bit line BL. In the embodiment, the RHA detection circuit 240 may also analyze a spare row address XRED and calculate the row hammer refresh address RHA.

Figure 3:
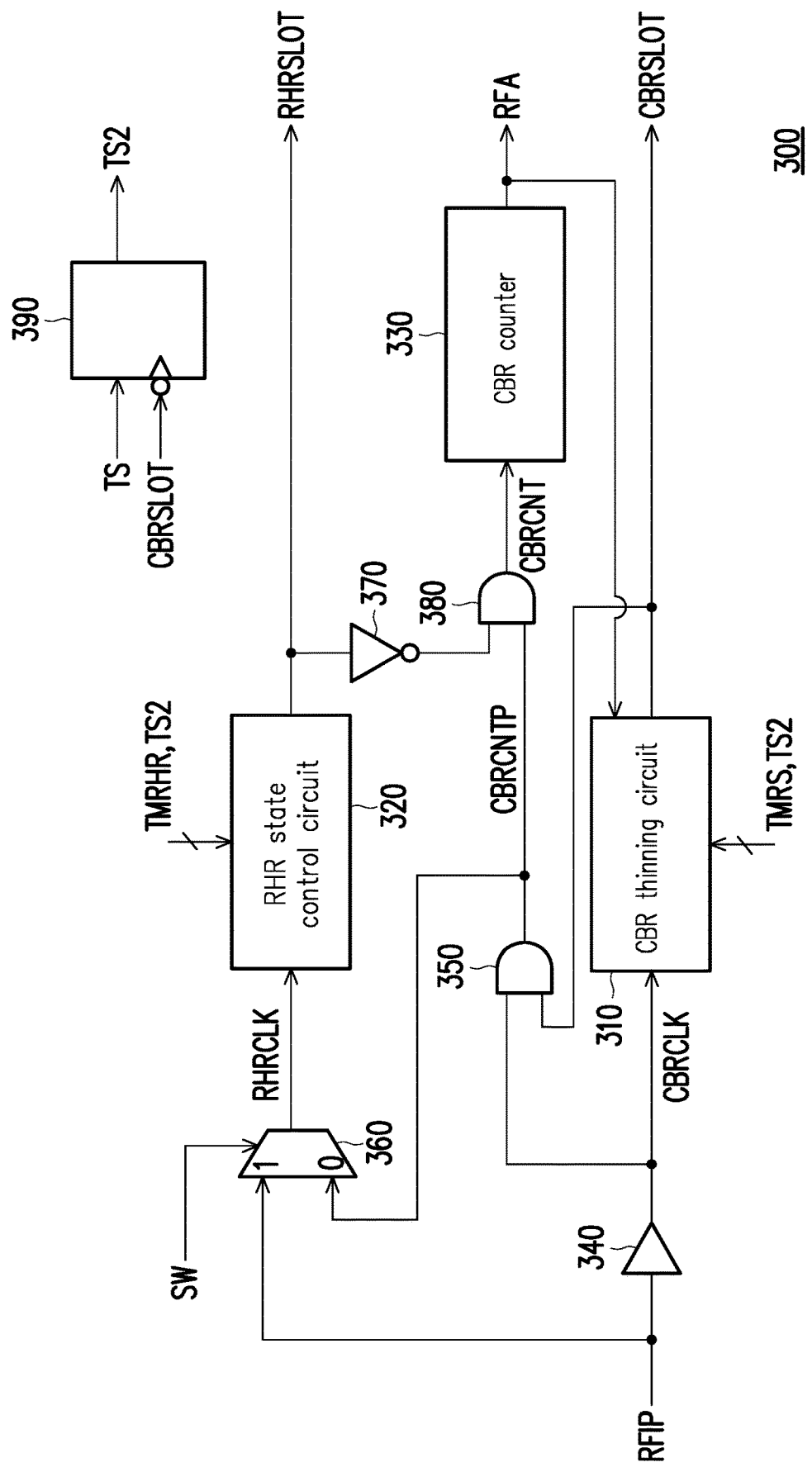
FIG. 3 is a circuit schematic diagram of a refresh controller according to an embodiment of the disclosure.

An example of a detailed structure of the refresh controller of the embodiment is described below. FIG. 3 is a circuit schematic diagram of a refresh controller 300 according to an embodiment of the disclosure. As shown in FIG. 3, the refresh controller 300 includes a CBR thinning circuit 310, an RHR state control circuit 320, and a CBR counter 330.

The CBR thinning circuit 310 may output the first refresh signal CBRSLOT based on a first clock CBRCLK, and adjust an output interval of the first refresh signal CBRSLOT according to a temperature signal TS2, the first refresh setting information TMRS, and the CBR refresh address RFA.

The RHR state control circuit 320 is coupled to the CBR thinning circuit 310. The RHR state control circuit 320 may output the second refresh signal RHRSLOT based on a second clock RHRCLK, and adjust an output interval of the second refresh signal RHRSLOT according to the temperature signal TS2 and the second refresh setting information TMRHR.

The CBR counter 330 is, for example, any type of counting element/circuit with a counting function. The CBR counter 330 is coupled to the CBR thinning circuit 310 and the RHR state control circuit 320. The CBR counter 330 counts a number of executions of the first refresh operation according to a counting signal CBRCNT to generate the CBR refresh address RFA.

In FIG. 3, the CBR thinning circuit 310, the RHR state control circuit 320, and the CBR counter 330 are respectively connected through a buffer gate 340, an AND gate 350, a multiplexer 360, an inverter 370, and an AND gate 380. A flip-flop 390 is adapted to provide the temperature signal TS2 in response to the inverted first refresh signal CBRSLOT according to the temperature signal TS.

As shown in FIG. 3, an input terminal of the buffer gate 340 is coupled to the refresh operation signal RFIP, and an output terminal of the buffer gate 340 may generate the first clock CBRCLK. A first input terminal of the AND gate 350 is coupled to the output terminal of the buffer gate 340, and a second input terminal of the AND gate 350 receives the first refresh signal CBRSLOT, and an output terminal of the AND gate 350 generates a counting signal CBRCNTP.

A first terminal of the multiplexer 360 is coupled to the refresh operation signal RFIP, a second terminal of the multiplexer 360 receives the count signal CBRCNTP, and the multiplexer 360 selects the refresh operation signal RFIP or the counting signal CBRCNTP as the second clock RHRCLK for output according to a mode switching signal SW. An input terminal of the inverter 370 is coupled to the second refresh signal RHRSLOT. A first input terminal of the AND gate 380 is coupled to an output terminal of the inverter 370, a second input terminal of the AND gate 380 is coupled to the counting signal CBRCNTP, and an output terminal of the AND gate 380 outputs the counting signal CBRCNT to the CBR counter 330. The operation principle of the refresh controller 300 shown in FIG. 3 is further described below.

The refresh controller 300 may receive the refresh operation signal RFIP provided by the command decoder 150 when the command signal COM indicating the refresh command is generated. The refresh operation signal RFIP is received and output by the buffer gate 340 to serve as the first clock CBRCLK, and is provided to the CBR thinning circuit 310 and the AND gate 350.

The CBR thinning circuit 310 may generate the first refresh signal CBRSLOT based on the first clock CBRCLK according to the temperature signal TS2 and the first refresh setting information TMRS.

The AND gate 350 is adapted to gate the first clock CBRCLK. When the first refresh signal CBRSLOT is 1 (the high logic level), the first clock CBRCLK is output as the counting signal CBRCNTP and sent to the AND gate 380. When the second refresh signal RHRSLOT signal is 0 (the low logic level), the counting signal CBRCNT is equal to the first clock CBRCLK and is provided to the CBR counter 330 of a next stage to serve as a basis for executing the counting operation.

When the second refresh signal RHRSLOT is 1 (the high logic level), the refresh operation of the CBR refresh is prohibited to perform the refresh operation of the row hammer refresh. At the same time, the counting signal CBRCNT is maintained to 0 (the low logic level), and the CBR counter 330 does not count, which corresponds to the prohibition of the CBR refresh. In other words, the CBR counter 330 counts the number of times of the CBR refreshes to generate the CBR refresh address RFA.

On the other hand, the refresh operation signal RFIP and the counting signal CBRCNTP are provided to the multiplexer 360. The multiplexer 360 selects the refresh operation signal RFIP or the counting signal CBRCNTP to serve as the second clock RHRCLK to drive the RHR state control circuit 320 of the next stage according to the mode switching signal SW. The RHR state control circuit 320 is a circuit for generating the second refresh signal RHRSLOT.

The RHR state control circuit 320 may generate the second refresh signal RHRSLOT based on the second clock RHRCLK according to the temperature signal TS2 and the second refresh setting information TMRHR.

It should be noted that in the embodiment, although the purposes of the CBR refresh and the row hammer refresh are different, the first refresh signal CBRSLOT for the CBR refresh and the second refresh signal RHRSLOT for the row hammer refresh are both generated according to the refresh operation signal RFIP. However, as shown in FIG. 3, the multiplexer 360 may select the refresh action signal RFIP or the counting signal CBRCNTP to serve as the second clock RHRCLK according to the mode switching signal SW.

The mode switching signal SW may be, for example, provided by the command decoder 150. When the mode switching signal SW is equal to the low logic level (a mode A), the multiplexer 360 may output the counting signal CBRCNTP as the second clock RHRCLK. In the mode A, due to the function of the AND gate 350, the second clock RHRCLK may also be adjusted along with the temperature signal TS2 (corresponding to the adjustment of the first refresh signal CBRSLOT by the CBR thinning circuit 310 according to the temperature signal TS2).

Since the refresh skip rate of the CBR thinning circuit 310 increases as the temperature decreases, if the second refresh signal RHRSLOT is not to be affected by the temperature, the RHR state control circuit 320 also needs to accordingly adjust the refresh interruption rate to be higher according to the temperature signal TS2.

Figure 4A:
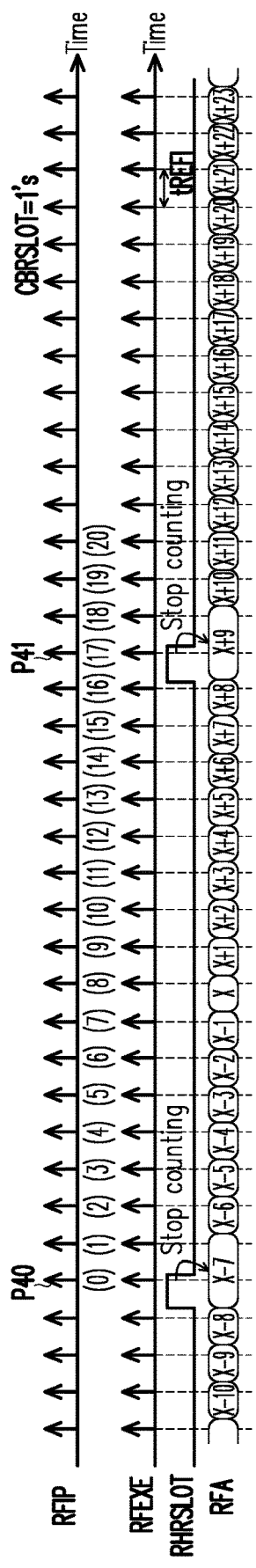
FIG. 4A to FIG. 4C are schematic diagrams of waveforms of a refresh operation of a semiconductor memory apparatus according to an embodiment of the disclosure.
Figure 4B:
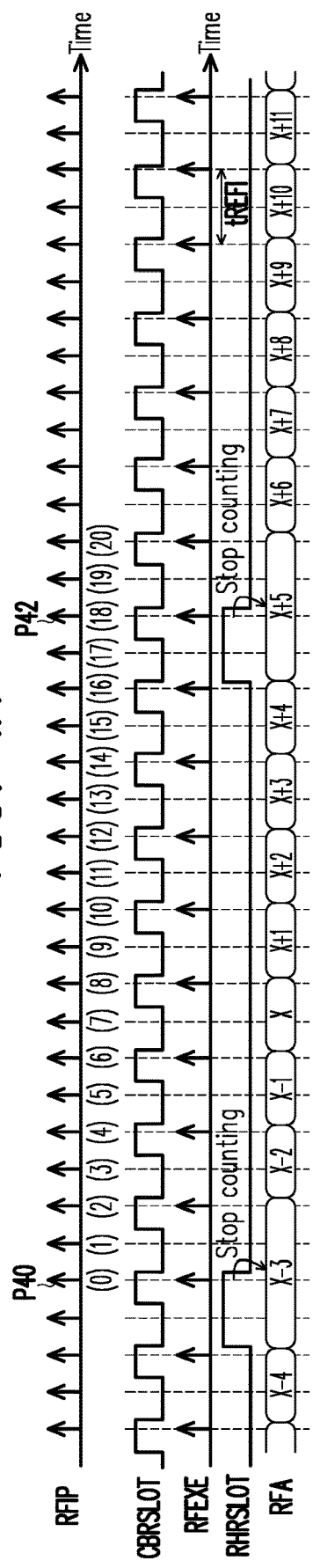
Figure 4C:
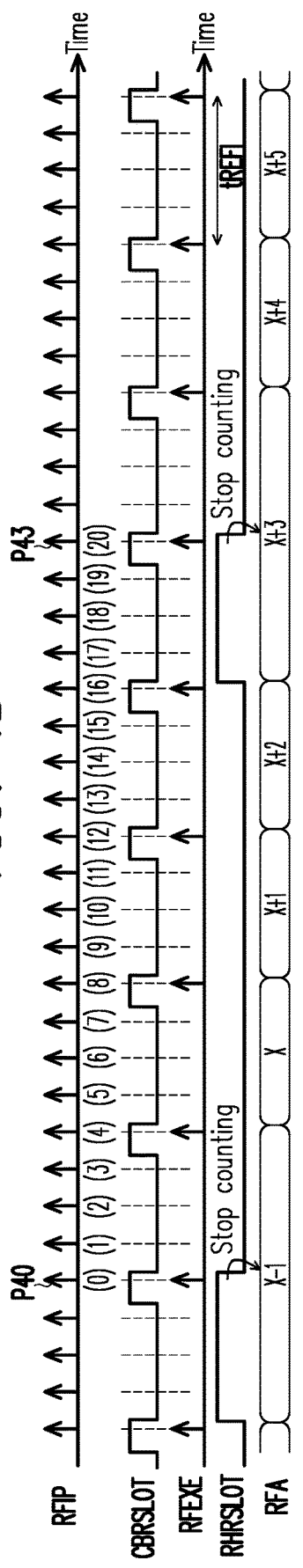

FIG. 4A to FIG. 4C are schematic diagrams of waveforms of a refresh operation of a semiconductor memory apparatus according to an embodiment of the disclosure. Referring to FIG. 3 and FIG. 4A to FIG. 4C at the same time, the refresh operation performed when the mode switching signal SW is equal to the low logic level (the mode A) is described below.

FIG. 4A illustrates a signal waveform in which a multiple of a refresh interval tREFI of the first refresh operation (the CBR refresh) is 1×. The multiple of the refresh interval tREFI is determined by the CBR thinning circuit 310 according to the temperature signal TS2 and the first refresh setting information TMRS. Where, x is, for example, an arbitrary integer, as long as the change of the CBR refresh address RFA may be seen.

In the case of FIG. 4A, the CBR thinning circuit 310 does not skip any first clock CBRCLK, and the refresh interval tREFI of the first refresh operation may be equal to the interval of the refresh operation signal RFIP. Therefore, the waveform of the effective refresh signal RFEXE is equal to the refresh operation signal RFIP.

At a pulse P40 of the refresh operation signal RFIP, the RHR state control circuit 320 generates a $1^{st}$ second refresh signal RHRSLOT. Due to the functions of the inverter 370 and the AND gate 380, the CBR counter 330 may suspend counting at this moment, so that the CBR refresh address RFA stays at X-7. At the same time, the memory block performs the second refresh operation. Thereafter, at a pulse P41 of the refresh operation signal RFIP, the RHR state control circuit 320 further generates a $2^{nd}$ second refresh signal RHRSLOT.

FIG. 4B illustrates a signal waveform in which the multiple of the refresh interval tREFI of the first refresh operation (the CBR refresh) is 2×.

In the case of FIG. 4B, the CBR thinning circuit 310 may skip half of the first clock CBRCLK, and the refresh interval tREFI of the first refresh operation may be equal to twice of the interval of the refresh operation signal RFIP.

At the pulse P40 of the refresh operation signal RFIP, the first refresh signal CBRSLOT and the second refresh signal RHRSLOT may conflict (generated at the same time). When the conflict occurs, the refresh controller 300 does not extend or adjust the time during which the first refresh signal CBRSLOT or the second refresh signal RHRSLOT is at a high logic level, so that the memory block may execute the second refresh operation in priority and meanwhile skip the first refresh operation. Due to the functions of the inverter 370 and the AND gate 380, the CBR counter 330 may suspend counting at this moment, so that the CBR refresh address RFA stays at X-3. Thereafter, at a pulse P42 of the refresh operation signal RFIP, the first refresh signal CBRSLOT and the $2^{nd}$ second refresh signal RHRSLOT conflict again, and the CBR counter 330 suspends counting again.

FIG. 4C illustrates a signal waveform in which the multiple of the refresh interval tREFI of the first refresh operation (the CBR refresh) is 4×. In the case of FIG. 4C, the CBR thinning circuit 310 may skip three-quarters of the first clock CBRCLK, and the refresh interval tREFI of the first refresh operation may be equal to four times of the interval of the refresh operation signal RFIP.

At the pulse P40 of the refresh operation signal RFIP, the first refresh signal CBRSLOT and the 1$^{st}$ second refresh signal RHRSLOT may conflict. When the conflict occurs, the refresh controller 300 does not extend or adjust the time during which the first refresh signal CBRSLOT or the second refresh signal RHRSLOT is at the high logic level. Therefore, the memory block may execute the second refresh operation in priority and meanwhile skip the first refresh operation. Due to the functions of the inverter 370 and the AND gate 380, the CBR counter 330 may suspend counting at this moment, so that the CBR refresh address RFA stays at X-1. Thereafter, at a pulse P43 of the refresh operation signal RFIP, the first refresh signal CBRSLOT and the 2$^{nd}$ second refresh signal RHRSLOT conflict again, and the CBR counter 330 suspends counting again.

Referring back to FIG. 3, when the mode switching signal SW is equal to the high logic level (a mode B), the multiplexer 360 may directly output the refresh operation signal RFIP as the second clock RHRCLK.

Figure 5A:
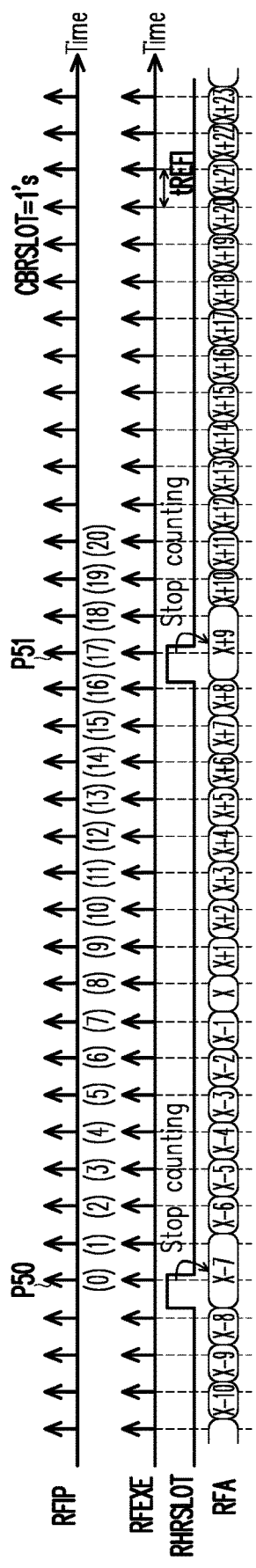
FIG. 5A to FIG. 5C are schematic diagrams of waveforms of a refresh operation of a semiconductor memory apparatus according to an embodiment of the disclosure.
Figure 5B:
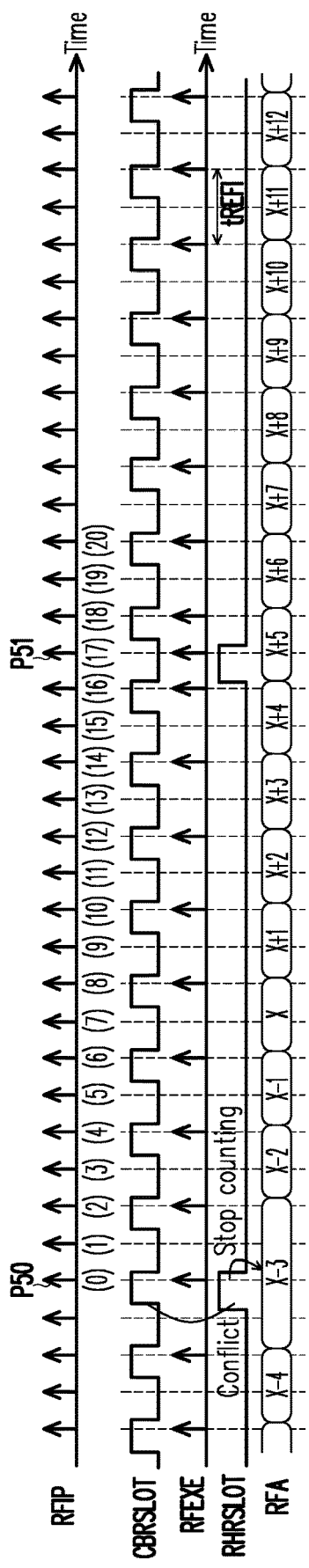
Figure 5C:
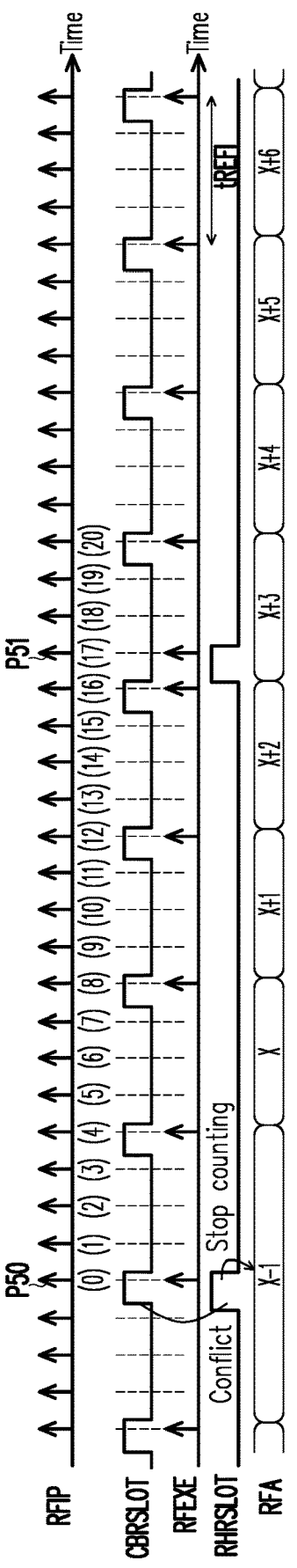

FIG. 5A to FIG. 5C are schematic diagrams of waveforms of a refresh operation of a semiconductor memory apparatus according to an embodiment of the disclosure. Referring to FIG. 3 and FIG. 5A to FIG. 5C at the same time, the refresh operation performed when the mode switching signal SW is equal to the high logic level (the mode B) is described below.

FIG. 5A illustrates a signal waveform in which a multiple of a refresh interval tREFI of the first refresh operation (the CBR refresh) is 1×. In the case of FIG. 5A, the CBR thinning circuit 310 does not skip any first clock CBRCLK, and the refresh interval tREFI of the first refresh operation may be equal to the interval of the refresh operation signal RFIP. Therefore, the waveform of the effective refresh signal RFEXE is equal to the refresh operation signal RFIP.

At a pulse P50 of the refresh operation signal RFIP, the RHR state control circuit 320 generates a 1$^{st}$ second refresh signal RHRSLOT. Due to the functions of the inverter 370 and the AND gate 380, the CBR counter 330 may suspend counting at this moment, so that the CBR refresh address RFA stays at X-7. At the same time, the memory block performs the second refresh operation. Thereafter, at a pulse P51 of the refresh operation signal RFIP, the RHR state control circuit 320 further generates a 2$^{nd}$ second refresh signal RHRSLOT.

FIG. 5B illustrates a signal waveform in which the multiple of the refresh interval tREFI of the first refresh operation (the CBR refresh) is 2×. In the case of FIG. 5B, the CBR thinning circuit 310 may skip half of the first clock CBRCLK, and the refresh interval tREFI of the first refresh operation may be equal to twice of the interval of the refresh operation signal RFIP.

At the pulse P50 of the refresh operation signal RFIP, the first refresh signal CBRSLOT and the second refresh signal RHRSLOT may conflict. When the conflict occurs, the refresh controller 300 does not extend or adjust the time during which the first refresh signal CBRSLOT or the second refresh signal RHRSLOT is at the high logic level, so that the memory block may execute the second refresh operation in priority and meanwhile skip the first refresh operation. Due to the functions of the inverter 370 and the AND gate 380, the CBR counter 330 may suspend counting at this moment, so that the CBR refresh address RFA stays at X-3.

Different to the situation in FIG. 4B, the second clock RHRCLK is not determined by the first refresh signal CBRSLOT. Therefore, at a pulse P51 of the refresh operation signal RFIP, the first refresh signal CBRSLOT and the second refresh signal RHRSLOT do not conflict.

FIG. 5C illustrates a signal waveform in which the multiple of the refresh interval tREFI of the first refresh operation (the CBR refresh) is 4×. In the case of FIG. 5C, the CBR thinning circuit 310 may skip three-quarters of the first clock CBRCLK, and the refresh interval tREFI of the first refresh operation may be equal to four times of the interval of the refresh operation signal RFIP.

At the pulse P50 of the refresh operation signal RFIP, the first refresh signal CBRSLOT and the second refresh signal RHRSLOT may conflict. As shown in FIG. 5C, when the conflict occurs, the refresh controller 300 does not extend or adjust the time during which the first refresh signal CBRSLOT or the second refresh signal RHRSLOT is at the high logic level. Therefore, the memory block may execute the second refresh operation in priority and meanwhile skip the first refresh operation. Due to the functions of the inverter 370 and the AND gate 380, the CBR counter 330 may suspend counting at this moment, so that the CBR refresh address RFA stays at X-1.

Different to the situation in FIG. 4C, the second clock RHRCLK is not determined by the first refresh signal CBRSLOT. Therefore, at the pulse P51 of the refresh operation signal RFIP, the first refresh signal CBRSLOT and the second refresh signal RHRSLOT do not conflict.

Figure 6:
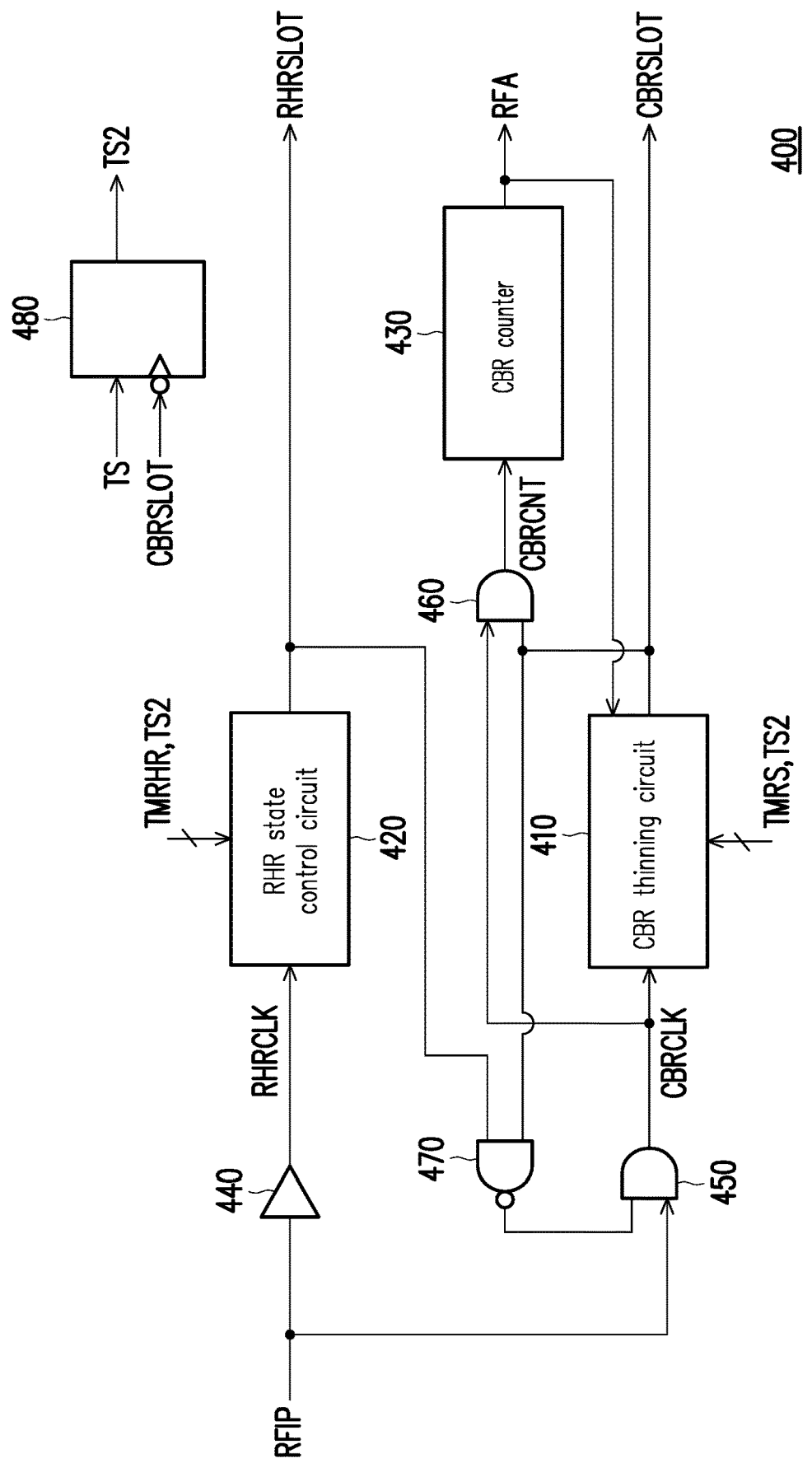
FIG. 6 is a schematic circuit diagram of a refresh controller according to an embodiment of the disclosure.

Referring back to FIG. 3, in the embodiment of FIG. 3, in the case where the first refresh signal CBRSLOT and the second refresh signal RHRSLOT are generated at the same time, proper control cannot be performed. When the mode switching signal SW is equal to the low logic level (the mode A), since the multiplexer 360 may output the counting signal CBRCNTP associated with the first clock CBRCLK as the second clock RHRCLK to the RHR state control circuit 320, the second refresh operation is limited to the original opportunity of the first refresh operation, so that it is impossible to achieve the high-frequency second refresh operation at a low temperature. When the mode switching signal SW is equal to the high logic level (the mode B), the contention problem is only revolved by executing the second refresh operation in priority, but the chance of the first refresh operation is reduced, and the problem of data loss then occurs. FIG. 6 illustrates a circuit that corrects the aforementioned shortcomings.

FIG. 6 is a schematic circuit diagram of a refresh controller 400 according to an embodiment of the disclosure. Operation methods of a CBR thinning circuit 410, an RHR state control circuit 420, and a CBR counter 430 are the same as or similar to the aforementioned CBR thinning circuit 310, the RHR state control circuit 320, and the CBR counter 330, respectively, so the operation methods are not repeated here.

Different to the aforementioned embodiment, in the embodiment, the CBR thinning circuit 410, the RHR state control circuit 420, and the CBR counter 430 are respectively connected through a buffer gate 440, an AND gate 450, an AND gate 460, and a NAND gate 470. An input terminal of the buffer gate 440 is coupled to the refresh operation signal RFIP, and an output terminal of the buffer gate 440 generates the second clock RHRCLK.

A first input terminal of the AND gate 450 is coupled to the refresh operation signal RFIP, and an output terminal of the AND gate 450 generates the first clock CBRCLK. A first input terminal of the AND gate 460 is coupled to the first clock CBRCLK, a second input terminal of the AND gate 460 is coupled to the first refresh signal CBRSLOT, and an output terminal of the AND gate 460 generates the counting signal CBRCNT. A first input terminal of the NAND gate 470 is coupled to the second refresh signal RHRSLOT, a second input terminal of the NAND gate 470 is coupled to the first refresh signal CBRSLOT, and an output terminal of the NAND gate 470 is coupled to a second input terminal of the AND gate 450. The flip-flop 480 is adapted to provide the temperature signal TS2 according to the temperature signal TS in response to the inverted first refresh signal CBRSLOT.

According to the circuit configuration shown in FIG. 6, not only the second refresh operation is not limited to the original opportunity of the first refresh operation, but also the opportunity of the first refresh operation is not reduced, so that the shortcomings of the aforementioned embodiment are corrected.

FIG. 7A to FIG. 7C are schematic diagrams of waveforms of a refresh operation of a semiconductor memory apparatus according to an embodiment of the disclosure. Referring to FIG. 6 and FIG. 7A to FIG. 7C at the same time, the refresh operation of the embodiment is described below.

FIG. 7A illustrates a signal waveform in which a multiple of the refresh interval tREFI of the first refresh operation (the CBR refresh) is 1×. In the case of FIG. 7A, the CBR thinning circuit 310 does not skip any first clock CBRCLK, and the refresh interval tREFI of the first refresh operation may be equal to the interval of the refresh operation signal RFIP. Therefore, the waveform of the effective refresh signal RFEXE is equal to the refresh operation signal RFIP.

At a pulse P70 of the refresh operation signal RFIP, the RHR state control circuit 420 generates a $1^{st}$ second refresh signal RHRSLOT. Due to the functions of the inverter 370 and the AND gate 380, the CBR counter 330 may suspend counting at this moment, so that the CBR refresh address RFA stays at X-7. Thereafter, at a pulse P71 of the refresh operation signal RFIP, the RHR state control circuit 420 further generates a $2^{nd}$ second refresh signal RHRSLOT.

FIG. 7B illustrates a signal waveform in which the multiple of the refresh interval tREFI of the first refresh operation (the CBR refresh) is 2×. In the case of FIG. 7B, the CBR thinning circuit 410 may skip half of the first clock CBRCLK, and the refresh interval tREFI of the first refresh operation may be equal to twice of the interval of the refresh operation signal RFIP.

In FIG. 7B, at the pulse P70 of the refresh operation signal RFIP, the first refresh signal CBRSLOT and the second refresh signal RHRSLOT may conflict. Due to the functions of the NAND gate 470, the AND gate 450 and the AND gate 460, the CBR counter 330 may suspend counting at this moment, so that the CBR refresh address RFA stays at X-3. Meanwhile, the memory block may execute the second refresh operation.

When the conflict occurs, the refresh controller 400 extends the time during which the first refresh signal CBRSLOT is at the high logic level, so that the first refresh operation may be performed at a time point of a next refresh operation signal RFIP. Therefore, the opportunity of the first refresh operation is not reduced.

Similarly, at the pulse P71 of the refresh operation signal RFIP, the refresh controller 400 also extends the time during which the first refresh signal CBRSLOT is at the high logic level, so that the first refresh operation may be performed at the time point of the next refresh operation signal RFIP.

FIG. 7C illustrates a signal waveform in which the multiple of the refresh interval tREFI of the first refresh operation (the CBR refresh) is 4×. In the case of FIG. 7C, the CBR thinning circuit 410 may skip three-quarters of the first clock CBRCLK, and the refresh interval tREFI of the first refresh operation may be equal to four times of the interval of the refresh operation signal RFIP.

At the pulse P70 of the refresh operation signal RFIP, the first refresh signal CBRSLOT and the $1^{st}$ second refresh signal RHRSLOT may conflict. Due to the functions of the AND gate 470, the AND gate 460, and the AND gate 460, the CBR counter 330 may suspend counting at this moment, so that the CBR refresh address RFA stays at X-1. Meanwhile, the memory block may execute the second refresh operation.

However, when the conflict occurs, as shown in FIG. 7C, the refresh controller 400 extends the time during which the first refresh signal CBRSLOT is at the high logic level, so that the first refresh operation may be performed at the time point of the next refresh operation signal RFIP. Therefore, the opportunity of the first refresh operation is not reduced.

Similarly, at the pulse P71 of the refresh operation signal RFIP, the refresh controller 400 also extends the time during which the first refresh signal CBRSLOT is at the high logic level, so that the first refresh operation may be performed at the time point of the next refresh operation signal RFIP.

Figure 8:
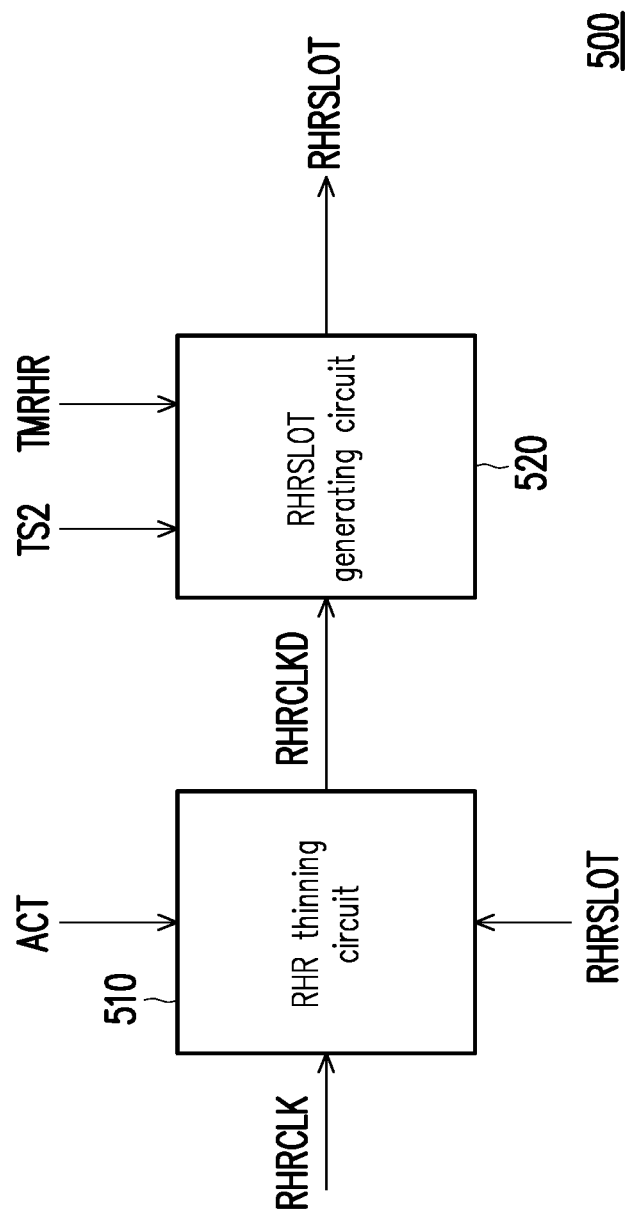
FIG. 8 is a circuit schematic circuit diagram of an RHR state control circuit according to an embodiment of the disclosure.

It should be noted that in an embodiment, the RHR state control circuit may also adjust an output interval of the second refresh signal RHRSLOT according to the number of times of accesses to the word line. For example, FIG. 8 is a circuit schematic circuit diagram of an RHR state control circuit 500 according to an embodiment of the disclosure. An RHR thinning circuit 510 may generate a third clock RHRCLKD according to the second clock RHRCLK, the second refresh signal RHRSLOT, and the active signals ACT corresponding to each of the memory blocks 140_1 to 140_N. Where, the RHR thinning circuit 510 may count the active signals ACT of each of the memory blocks 140_1 to 140_N to obtain the number of times of accesses to word line.

An RHRSLOT generating circuit 520 is coupled to the RHR thinning circuit 510. The RHRSLOT generating circuit 520 may generate the second refresh signal RHRSLOT based on the third clock RHRCLKD, and adjust an output interval of the second refresh signal RHRSLOT according to the temperature signal TS2 and the second refresh setting information TMRHR.

It should be noted that, in one embodiment, a corresponding refresh controller may also be configured for each memory block. To fully convey the spirit of the disclosure to those skilled in the art, another embodiment is provided below for detailed description.

Figure 9:
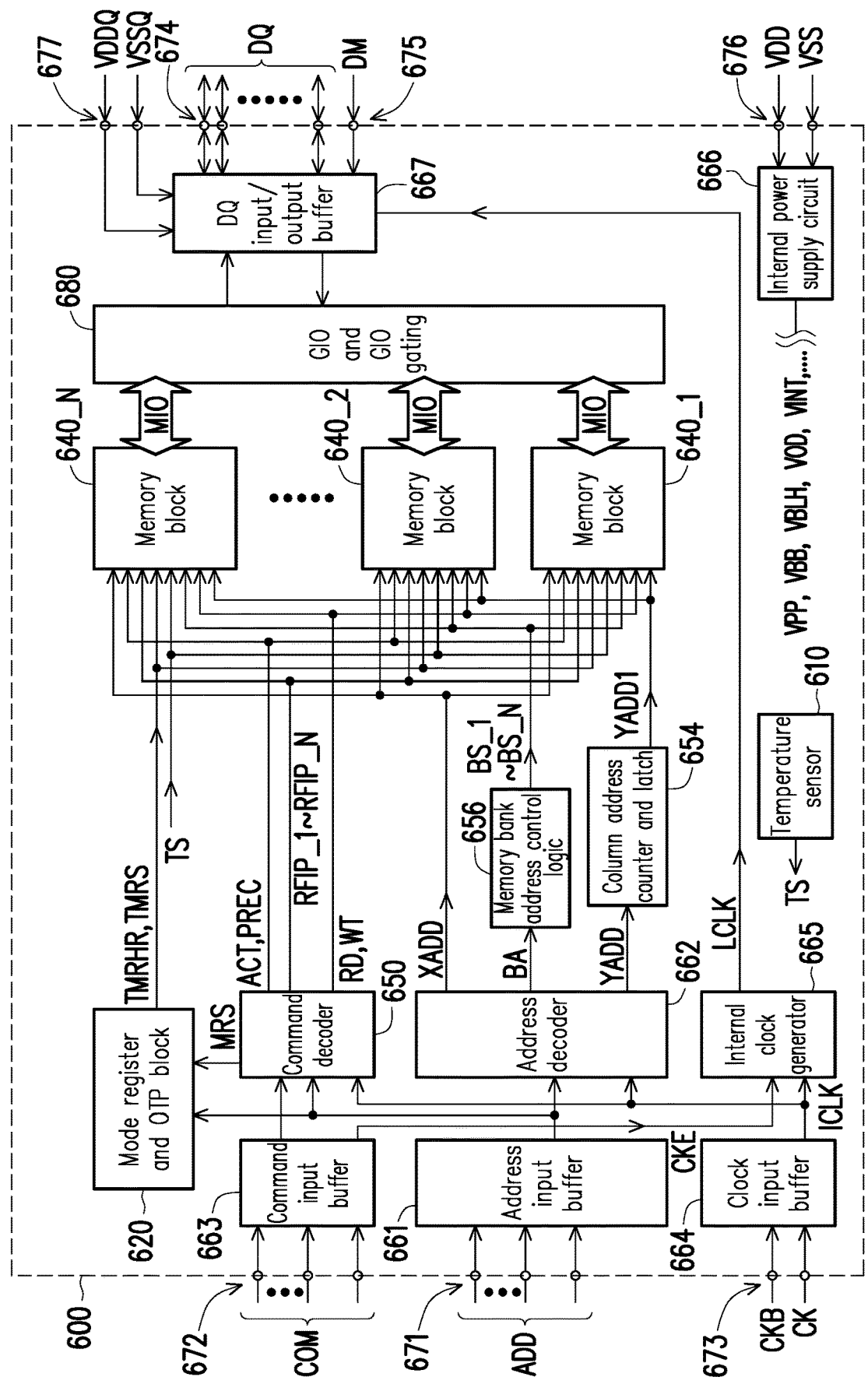
FIG. 9 is a schematic diagram of a semiconductor memory apparatus according to an embodiment of the disclosure.

FIG. 9 is a schematic diagram of a semiconductor memory apparatus 600 according to an embodiment of the disclosure. The semiconductor memory apparatus 600 includes a temperature sensor 610, a mode register and OTP block 620, memory blocks 640_1-640_N, and a command decoder 650. In the embodiment, a structure in which each of the memory blocks 640_1-640_N has a refresh controller for control is adopted.

Operation methods of the temperature sensor 610, the mode register and OTP block 620, a column address counter and latch 654, a memory bank address control logic 656, an address input buffer 661, an address decoder 662, a command input buffer 663, a clock input buffer 664, an internal clock generator 665, an internal power supply circuit 666, a DQ input/output buffer 667, an address terminal 671, a command terminal 672, a clock terminal 673, a data terminal 674, a data mask terminal 675, a power supply terminal 676, a power supply terminal 677, and a GIO and GIO gating 680 are respectively the same as or similar to that of the corresponding components in the aforementioned semiconductor memory apparatus 100, so that the operation methods thereof are not repeated.

Different from the aforementioned embodiment, when receiving the command signal COM indicating the refresh command, the command decoder 650 may start to generate refresh operation signals RFIP_1-RFIP_N, and provide the same to the memory blocks 640_1-640_N, respectively.

Figure 10:
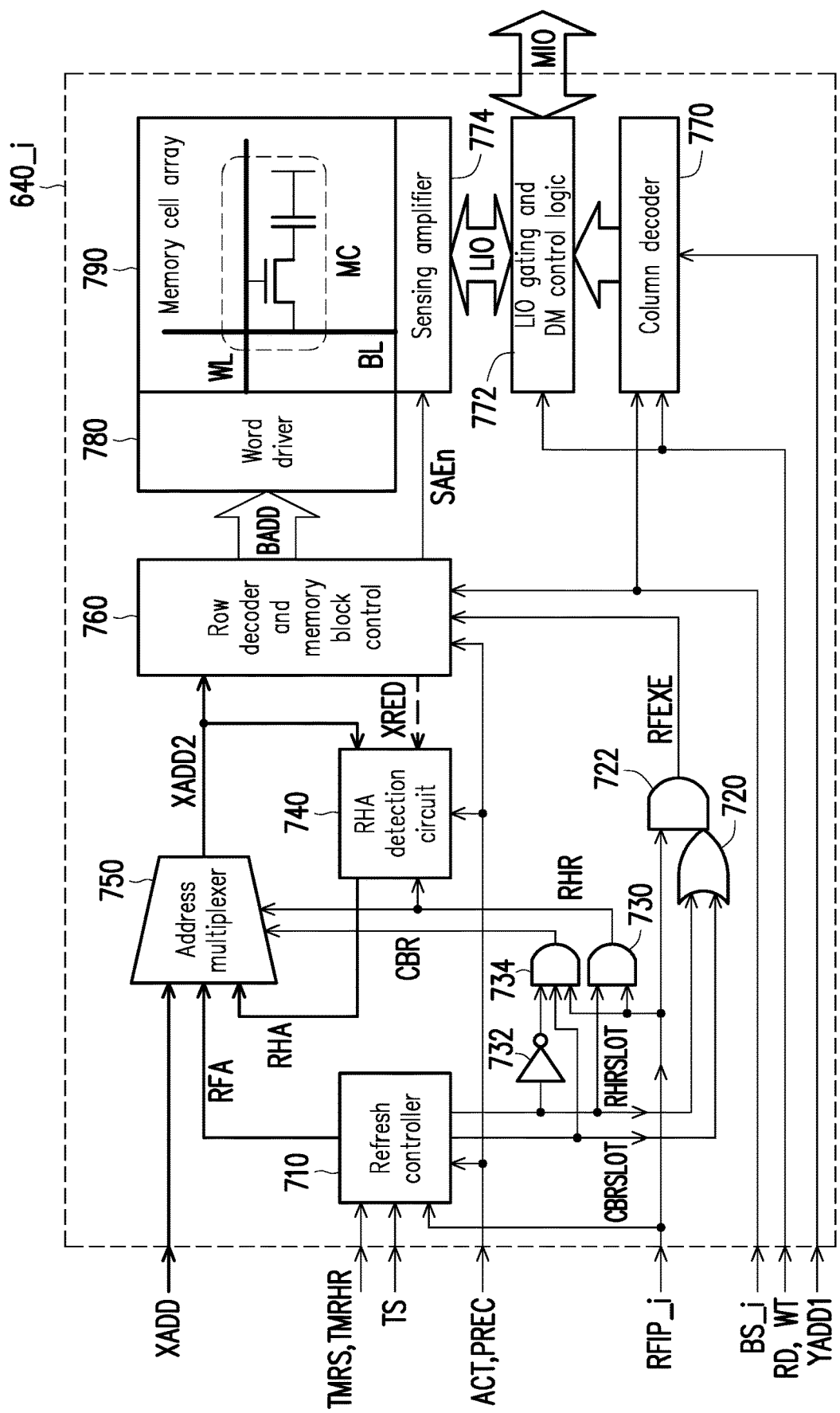
FIG. 10 is a schematic diagram of a memory block according to an embodiment of the disclosure.

An example of a detailed structure of the memory block of the embodiment is described below. FIG. 10 is a schematic diagram of a memory block 640_i according to an embodiment of the disclosure. As shown in FIG. 10, the memory block 640_i includes a refresh controller 710, an OR gate 720, an AND gate 722, an AND gate 730, an inverter 732, an AND gate 734, an RHA detection circuit 740, an address multiplexer 750, a row decoder and memory block control 760, a column decoder 770, a LIO gating and DM control logic 772, a sensing amplifier 774, a word driver 780, and a memory cell array 790.

The refresh controller 710 may respectively output the first refresh signal CBRSLOT and the second refresh signal RHRSLOT based on the refresh operation signal RFIP_i. The refresh controller 710 may adjust an output interval of the first refresh signal CBRSLOT according to the first refresh setting information TMRS and the temperature signal TS, and adjust an output interval of the second refresh signal RHRSLOT according to the second refresh setting information TMRHR and the temperature signal TS. In addition, the refresh controller 710 may generate the CBR refresh address RFA according to the adjusted first refresh signal CBRSLOT and second refresh signal RHRSLOT.

A first input terminal of the OR gate 720 is coupled to the first refresh signal CBRSLOT, a second input terminal of the OR gate 720 is coupled to the second refresh signal RHRSLOT. A first input terminal of the AND gate 722 is coupled to the refresh operation signal RFIP_i, a second input terminal of the AND gate 722 is coupled to an output terminal of the OR gate 720, and an output terminal of the AND gate 722 generates an effective refresh signal RFEXE. The effective refresh signal RFEXE may indicate a refresh operation of automatic refresh that is actually performed, which includes the CBR refresh and the row hammer refresh.

A first input terminal of the AND gate 730 is coupled to the refresh operation signal RFIP_i, a second input terminal of the AND gate 730 is coupled to the second refresh signal RHRSLOT, and an output terminal of the AND gate 730 generates the row hammer signal RHR.

An input terminal of the inverter 732 is coupled to the second refresh signal RHRSLOT. A first input terminal of the AND gate 734 is coupled to an output terminal of the inverter 732. A second input terminal of the AND gate 734 is coupled to the second refresh signal CBRSLOT. A third input terminal of the AND gate 734 is coupled to the refresh operation signal RFIP_i. An output terminal of the AND gate 734 generates a selection signal CBR.

The RHA detection circuit 740 is coupled to the output end of the AND gate 730. The RHA detection circuit 740 may analyze the second row address XADD2 in response to the active signal ACT, the pre-charge signal PREC and the row hammer signal RHR to generate the row hammer refresh address RHA. To be specific, the RHA detection circuit 740 may monitor the accesses to the word lines WL in the memory cell array 790 according to the current second row address XADD2, and detect the accesses that occur a predetermined number of times within a predetermined period, so as to calculate an address adjacent to the address with the predetermined number of times of accesses to serve as the row hammer refresh address RHA.

The refresh controller 710 in the memory block 640_i may respectively output the first refresh signal CBRSLOT and the second refresh signal RHRSLOT based on the refresh operation signal RFIP_i. The refresh controller 710 may adjust an output interval of the first refresh signal CBRSLOT according to the first refresh setting information TMRS and the temperature signal TS, and adjust an output interval of the second refresh signal RHRSLOT according to the second refresh setting information TMRHR and the temperature signal TS. In addition, the refresh controller 710 may generate the CBR refresh address RFA according to the adjusted first refresh signal CBRSLOT and second refresh signal RHRSLOT.

A first input terminal of the address multiplexer 750 is coupled to the data address XADD coming from the address decoder 662, and a second input terminal of the address multiplexer 750 is coupled to the CBR refresh address RFA coming from the refresh controller 710, a third input terminal of address multiplexer 750 is coupled to row hammer refresh address RHA. The address multiplexer 750 selects the data address XADD, the CBR refresh address RFA, or the row hammer refresh address RHA to output as the second row address XADD2 according to the selection signal CBR and the row hammer signal RHR.

Referring to FIG. 10, when the selection signal CBR is equal to the low logic level and the row hammer signal RHR is equal to the low logic level, it represents that it is a normal read or write operation at this moment, and the address multiplexer 750 may provide the data address XADD (an external input address) as a block access address BADD. When the selection signal CBR is equal to the high logic level and the row hammer signal RHR is equal to the low logic level, it represents that it is a refresh operation of the CBR refresh at this moment, and the address multiplexer 750 may use the CBR refresh address RFA calculated by the refresh controller 710 as the block access address BADD. When the selection signal CBR is equal to the low logic level and the row hammer signal RHR is equal to the high logic level, it represents that it is a refresh operation of the row hammer refresh at this moment, and the address multiplexer 750 may use the row hammer refresh address RHA as the block access address BADD.

Regarding the circuit configuration shown in FIG. 10, when the first refresh signal CBRSLOT and the second refresh signal RHRSLOT are output at the same time, the memory block 640_i may perform one of the first refresh operation and the second refresh operation. To be specific, when the second refresh signal RHRSLOT is output, regardless of whether the first refresh signal CBRSLOT is output at the same time, the configuration of the AND gate 730, inverter 732, and the AND gate 734 causes the address multiplexer 750 to select the row hammer refresh address RHA to serve as the second row address XADD2 for output, so as to perform the second refresh operation.

The operation methods of the row decoder and memory block control 760, the column decoder 770, the LIO gating and DM control logic 772, the sensing amplifier 774, the word driver 780, and the memory cell array 790 are respectively the same or similar as that of the corresponding components in the semiconductor memory apparatus 100, so that the operation methods are not repeated here.

In the embodiment, although a structure that each of the memory blocks 640_1-640_N has a refresh controller for control is adopted, the operation methods of the first refresh signal CBRSLOT and the second refresh signal RHRSLOT are not different from that of the aforementioned embodiment. Therefore, those skilled in the art may also apply the circuit configuration shown in FIG. 3, FIG. 6 and FIG. 8 to the semiconductor memory apparatus 600.

Figure 11A:
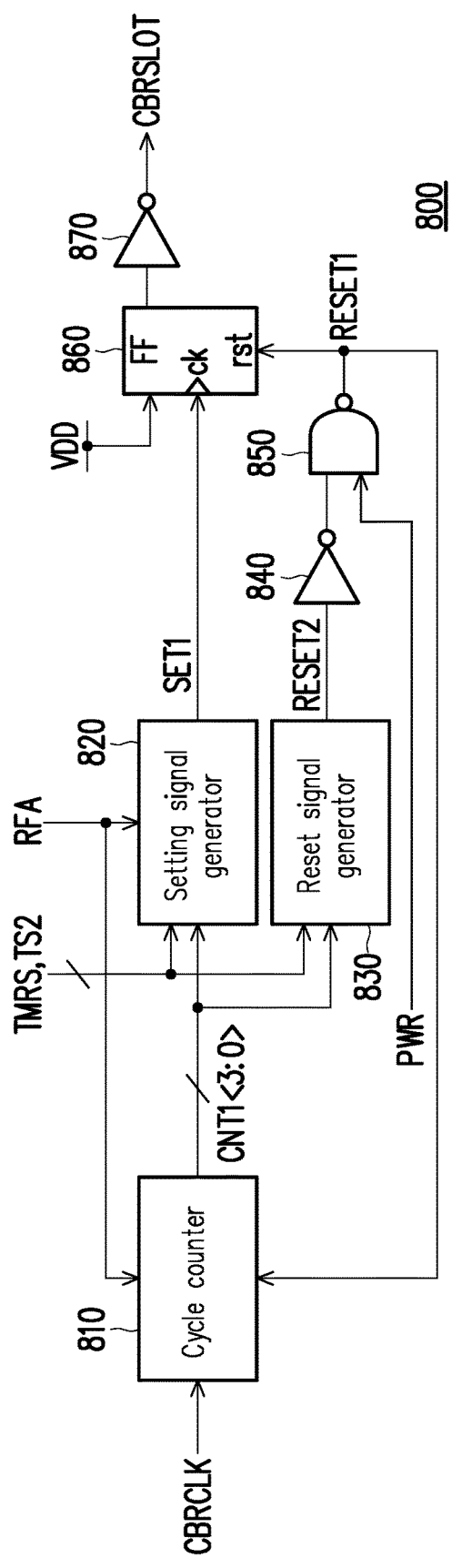
FIG. 11A is a schematic diagram of a CBR thinning circuit 800 according to an embodiment of the disclosure.

An internal structure of the CBR thinning circuit is further described below. FIG. 11A is a schematic diagram of a CBR thinning circuit 800 according to an embodiment of the disclosure. As shown in FIG. 11A, the CBR thinning circuit 800 includes a cycle counter 810, a setting signal generator 820, a reset signal generator 830, an inverter 840, a NAND gate 850, a flip-flop 860, and an inverter 870. The structure of the CBR thinning circuit 800 may be applied to the CBR thinning circuit 310 of FIG. 3 and the CBR thinning circuit 410 of FIG. 6.

The cycle counter 810 counts the first clock CBRCLK to generate a count value CNT1. In addition, the cycle counter 810 is controlled by a reset signal RESET1 to restart counting. The setting signal generator 820 is coupled to the cycle counter 810. The setting signal generator 820 may determine a setting value D1 according to the temperature signal TS2 and the first refresh setting information TMRS. When the count value CNT1 is changed from the setting value D1 to another value, the setting signal generator 820 generates a setting signal SET1. The reset signal generator 830 is coupled to the cycle counter 810. The reset signal generator 830 may determine a setting value D2 according to the temperature signal TS2 and the first refresh setting information TMRS. When the count value CNT1 is changed from the setting value D2 to another value, the reset signal generator 830 generates a reset signal RESET2.

An input terminal of the inverter 840 is coupled to the reset signal RESET2. A first input terminal of the NAND gate 850 is coupled to an output terminal of the inverter 840, a second input terminal of the NAND gate 850 is coupled to a start signal PWR, and an output terminal of the NAND gate 850 generates the reset signal RESET1. The flip-flop 860 is coupled to the setting signal generator 820 and the NAND gate 850. The flip-flop 860 may change a logic level of the output terminal according to the setting signal SET1 and the reset signal RESET1. In addition, an input terminal of the inverter 870 is coupled to an output terminal of the flip-flop 860, and an output terminal of the inverter 870 generates the first refresh signal CBRSLOT.

Figure 11B:
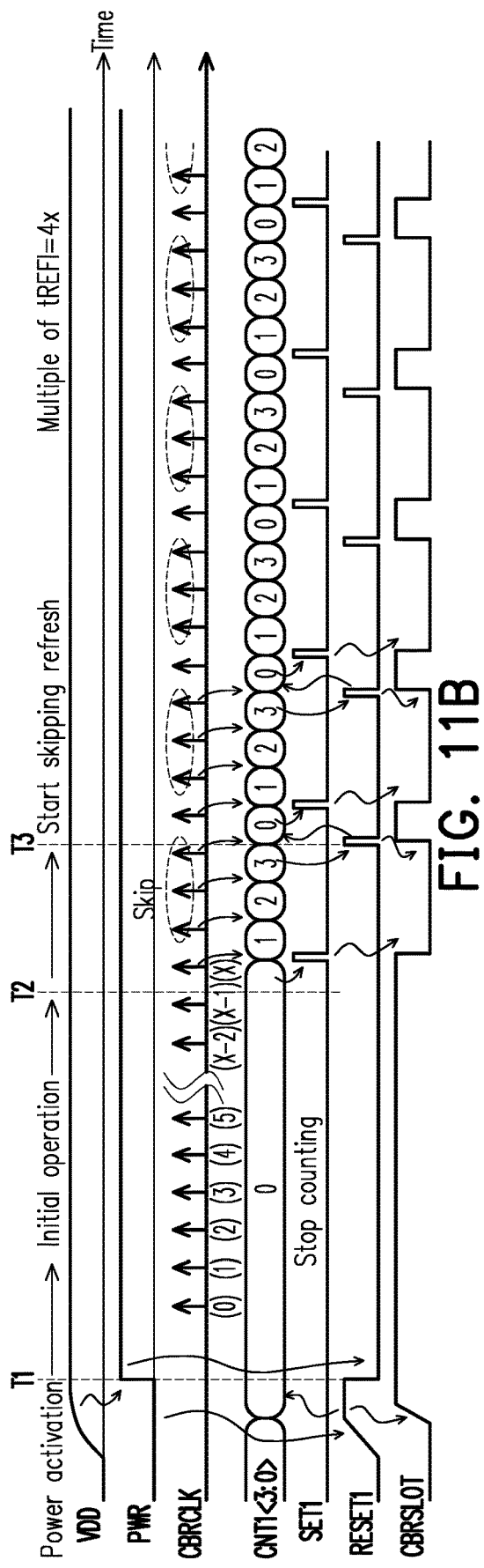
FIG. 11B is an example of an operation waveform of a CBR thinning circuit according to an embodiment of the disclosure.

FIG. 11B is an example of an operation waveform of a CBR thinning circuit according to an embodiment of the disclosure. Referring to FIG. 11A and FIG. 11B at the same time, the refresh operation of the embodiment is described below.

As shown in FIG. 11B, when a power supply is activated (i.e., at a time point T1), a power supply voltage VDD rises. In response to such situation, signals related to power activation are enabled. For example, when the power supply voltage VDD reaches a predetermined stable potential, the start signal PWR is changed from 0 to 1 (valid). Then, when the start signal PWR is enabled, an initial operation is performed, and the reset signal RESET1 is changed from 1 to 0. In addition to being provided to the cycle counter 810 and the flip-flop 860, the reset signal RESET1 may also be provided to other related circuits to implement a reset operation. In the reset operation, in addition to setting the first refresh signal CBRSLOT to 1 (valid), the CBR refresh address RFA of the CBR counter is, for example, reset to zero (stop counting).

Then, after the time point T1, the command decoder starts to periodically provide the command signal COM indicating the refresh command according to its own setting, so that it is started to periodically generate the first clock CBRCLK. However, when a count of the cycle counter 810 on the first clock CBRCLK is less than a threshold (for example, the threshold x=128), the circuit (the CBR thinning circuit 800) remains stopped according to a reset state. In other words, the refresh operation is performed for a period of time (initial operation). In the embodiment, the refresh operation may be used not only to retain data, but also to reset various circuits.

When the first clock CBRCLK continues to be generated and the count of the first clock CBRCLK by the cycle counter 810 reaches the threshold (i.e., a time point T2), the cycle counter 810 is released from the stop state, and the generated count value CNT1 is started to be increased. In response to such situation, when the count value CNT1 is increased from 0 (i.e., the setting value D1) to 1, the setting signal generator 820 generates a pulse of the setting signal SET1. A logic level of the output terminal of the flip-flop 860 may be changed to 1, and the first refresh signal CBRSLOT is 0 (invalid). In this way, the first clock CBRCLK may be skipped and the first refresh signal CBRSLOT is maintained to 0.

However, when the count value CNT1 reaches 3 (i.e., the setting value D2) and is about to change (i.e., a time point T3), the reset signal generator 830 may generate a reset signal RESET2. Along with this, the reset signal RESET1 is generated through the configuration of the inverter 840 and the NAND gate 850. The reset signal RESET1 may reset the flip-flop 860. The logic level of the output terminal of the flip-flop 860 may be changed to 0, and the first refresh signal CBRSLOT is 1 (valid). At the same time, before the count value CNT1 becomes 4, since the cycle counter 810 is also reset by the reset signal RESET1, the count value CNT1 may be reset to 0. In this way, the refresh interval adjustment is suspended without skipping the first clock CBRCLK of this moment.

Similarly, the first clock CBRCLK continues to be generated, and the cycle counter 810 increases the count value CNT1 from 0 to 1. In response to such situation, the setting signal generator 820 generates a pulse of the setting signal SET1. The logic level of the output terminal of the flip-flop 860 may be changed to 1, and the first refresh signal CBRSLOT is 0 (invalid). In this way, the refresh interval adjustment is restarted to skip the first clock CBRCLK and maintain the first refresh signal CBRSLOT to 0.

Thereafter, the above operations may be performed repeatedly. In the embodiment, the refresh cycle is extended by four times (refresh skip rate=3/4).

Figure 12A:
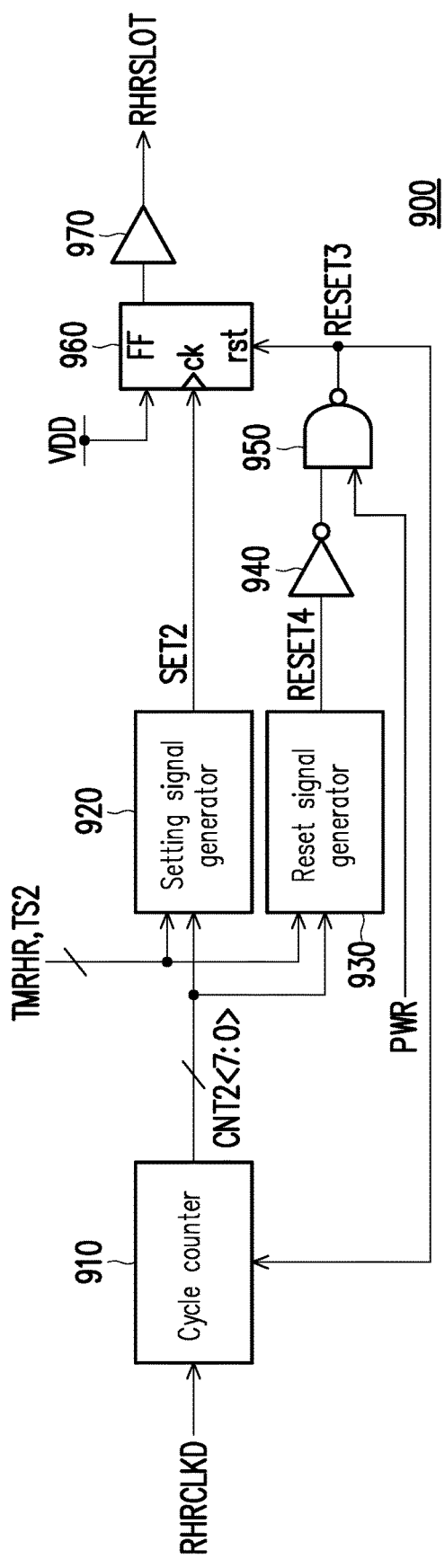
FIG. 12A is a schematic diagram of an RHRSLOT generating circuit according to an embodiment of the disclosure.

An internal structure of the RHRSLOT generating circuit is further described below. FIG. 12A is a schematic diagram of an RHRSLOT generating circuit 900 according to an embodiment of the disclosure. The structure of the RHRSLOT generating circuit 900 may be applied to the RHRSLOT generating circuit 520 of FIG. 8.

A cycle counter 910 counts the third clock RHRCLKD to generate a count value CNT2. In addition, the cycle counter 910 is controlled by a reset signal RESET3 to restart counting. A setting signal generator 920 is coupled to the cycle counter 910. The setting signal generator 920 may determine a setting value D3 according to the temperature signal TS2 and the second refresh setting information TMRHR. When the count value CNT2 is changed from the setting value D3 to another value, the setting signal generator 920 generates a setting signal SET2. A reset signal generator 930 is coupled to the cycle counter 910. The reset signal generator 930 may determine a setting value D4 according to the temperature signal TS2 and the second refresh setting information TMRHR. When the count value CNT2 is changed from the setting value D4 to another value, the reset signal generator 930 generates a reset signal RESET4.

An input terminal of an inverter 940 is coupled to the reset signal RESET4. A first input terminal of the NAND gate 950 is coupled to an output terminal of the inverter 940, a second input terminal of the NAND gate 950 is coupled to the start signal PWR, and an output terminal of the NAND gate 950 generates the reset signal RESET3. A flip-flop 960 is coupled to the setting signal generator 920 and the NAND gate 950. The flip-flop 960 may change a logic level of the output terminal according to the setting signal SET2 and the reset signal RESET3. In addition, an input terminal of a buffer gate 970 is coupled to an output terminal of the flip-flop 960, and an output terminal of the buffer gate 970 generates the second refresh signal RHRSLOT.

Figure 12B:
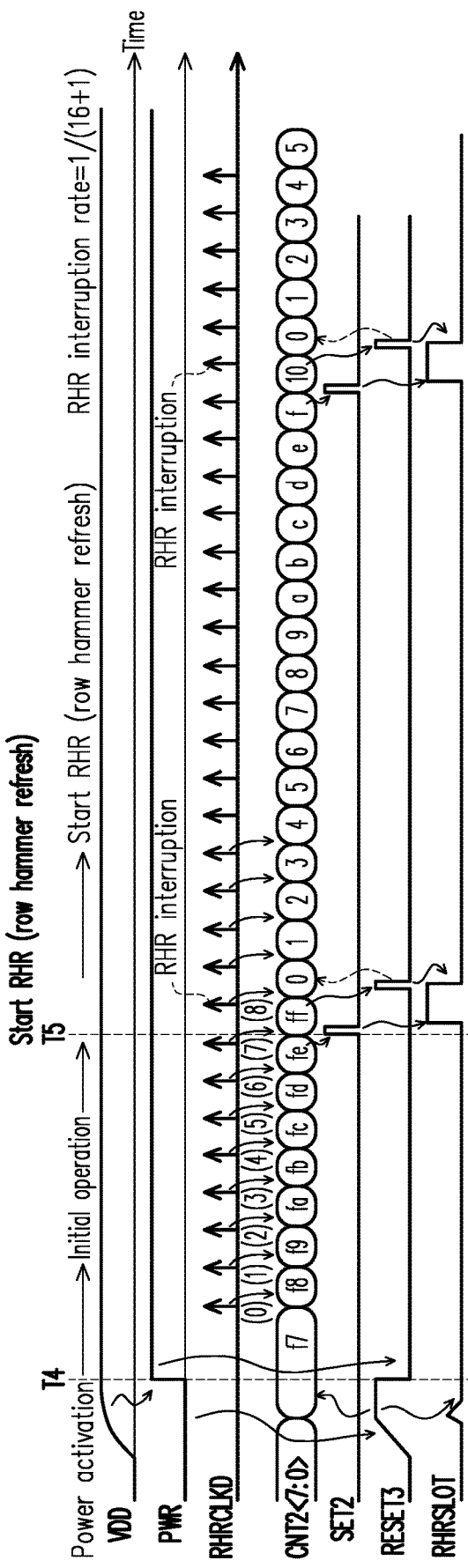
FIG. 12B is an example of an operation waveform of an RHRSLOT generating circuit according to an embodiment of the disclosure.

FIG. 12B is an example of an operation waveform of an RHRSLOT generating circuit according to an embodiment of the disclosure. Referring to FIG. 12A and FIG. 12B at the same time, the refresh operation of the embodiment is described below.

As shown in FIG. 12B, when the power supply is activated (i.e., at a time point T4), the power supply voltage VDD rises. In response to such situation, signals related to power activation are enabled. For example, when the power supply voltage VDD reaches a predetermined stable potential, the start signal PWR is changed from 0 to 1 (valid). Then, when the start signal PWR is enabled, an initial operation is performed, and the reset signal RESET3 is changed from 1 to 0, and becomes a pulse signal used for reset. In addition to being provided to the cycle counter 910 and the flip-flop 960, the reset signal RESET3 may also be provided to other related circuits to perform a reset operation at startup.

Then, after the time point T4, the control signal generator starts to periodically provide the command signal COM indicating the refresh command according to its own setting, so that it is started to periodically generate the third clock RHRCLKD.

When the initial operation is ended (i.e., at a time point T5), and when the count value CNT2 is increased from fe (a setting value D3) to ff, the setting signal generator 920 may generate a pulse of the setting signal SET2. A logic level of the output terminal of the flip-flop 960 may be changed to 1, and the second refresh signal RHRSLOT is 1 (valid).

However, when the count value CNT1 reaches ff (the setting value D4) and is about to change, the reset signal generator 930 may generate the reset signal RESET4. Along with such situation, the reset signal RESET3 is generated through the configuration of the inverter 940 and the NAND gate 950. The reset signal RESET3 may reset the flip-flop 960. A logic level of the output terminal of the flip-flop 960 may be changed to 0, and the second refresh signal RHRSLOT is changed to 0 (invalid).

Similarly, the third clock RHRCLKD continues to be generated, and the cycle counter 910 increases the count value CNT2 from f to 10. In response to such situation, the setting signal generator 920 may generate a pulse of the setting signal SET2. The logic level of the output terminal of the flip-flop 960 may be changed to 1, and the second refresh signal RHRSLOT is 1 (valid). In this way, the third clock RHRCLKD is interrupted again to generate the second refresh signal RHRSLOT. Thereafter, the above operation may be performed repeatedly.

Figure 13A:
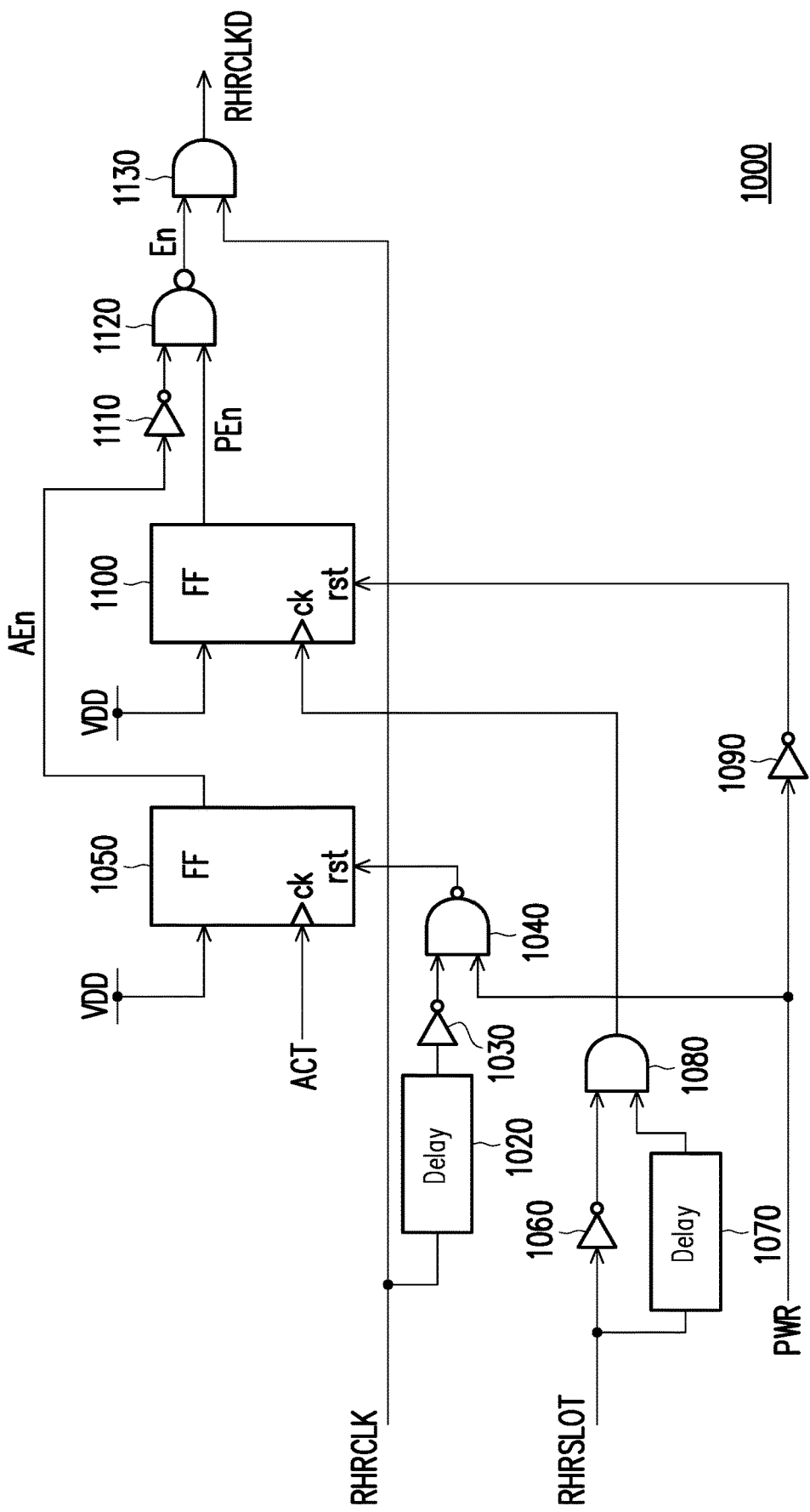
FIG. 13A is a schematic diagram of an RHR thinning circuit according to an embodiment of the disclosure.

An internal structure of the RHR thinning circuit is further described below. FIG. 13A is a schematic diagram of an RHR thinning circuit 1000 according to an embodiment of the disclosure. The structure of the RHR thinning circuit 1000 may be applied to the RHR thinning circuit 510 of FIG. 8.

An input terminal of a delay circuit 1020 is coupled to the second clock RHRCLK. An input terminal of an inverter 1030 is coupled to an output terminal of the delay circuit 1020. A first input terminal of NAND gate 1040 is coupled to an output terminal of the inverter 1030, and a second input terminal of the NAND gate 1040 is coupled to the start signal PWR. A first control terminal of a flip-flop 1050 is coupled to the active signal ACT, and a second control terminal of the flip-flop 1050 is coupled to an output terminal of the NAND gate 1040. An output terminal of the flip-flop 1050 is adapted to provide a first enable signal AEn.

An input terminal of an inverter 1060 is coupled to the second refresh signal RHRSLOT. An input terminal of a delay circuit 1070 is coupled to the second refresh signal RHRSLOT. A first input terminal of an AND gate 1080 is coupled to an output terminal of the inverter 1060, and a second input terminal of the AND gate 1080 is coupled to an output terminal of the delay circuit 1070. An input terminal of an inverter 1090 is coupled to the start signal PWR. A first control terminal of a flip-flop 1100 is coupled to an output terminal of the AND gate 1080, and a second control terminal of the flip-flop 1100 is coupled to an output terminal of the inverter 1090. An output terminal of the flip-flop 1100 is adapted to provide a second enable signal PEn.

An input terminal of an inverter 1110 is coupled to the output terminal of the flip-flop 1050 to receive the first enable signal AEn. A first input terminal of a NAND gate 1120 is coupled to an output terminal of the inverter 1110, and a second input terminal of the NAND gate 1120 is coupled to the output terminal of the flip-flop 1100 to receive the second enable signal PEn. An output terminal of the NAND gate 1120 is adapted to provide a third enable signal En. A first input terminal of an AND gate 1130 is coupled to the output terminal of the NAND gate 1120 to receive the third enable signal En, a second input terminal of the AND gate 1130 is coupled to the second clock RHRCLK, and an output terminal of the AND gate 1130 generates the third clock RHRCLKD. According to the circuit configuration shown in FIG. 13A, the function of the RHR thinning circuit may be implemented.

Figure 13B:
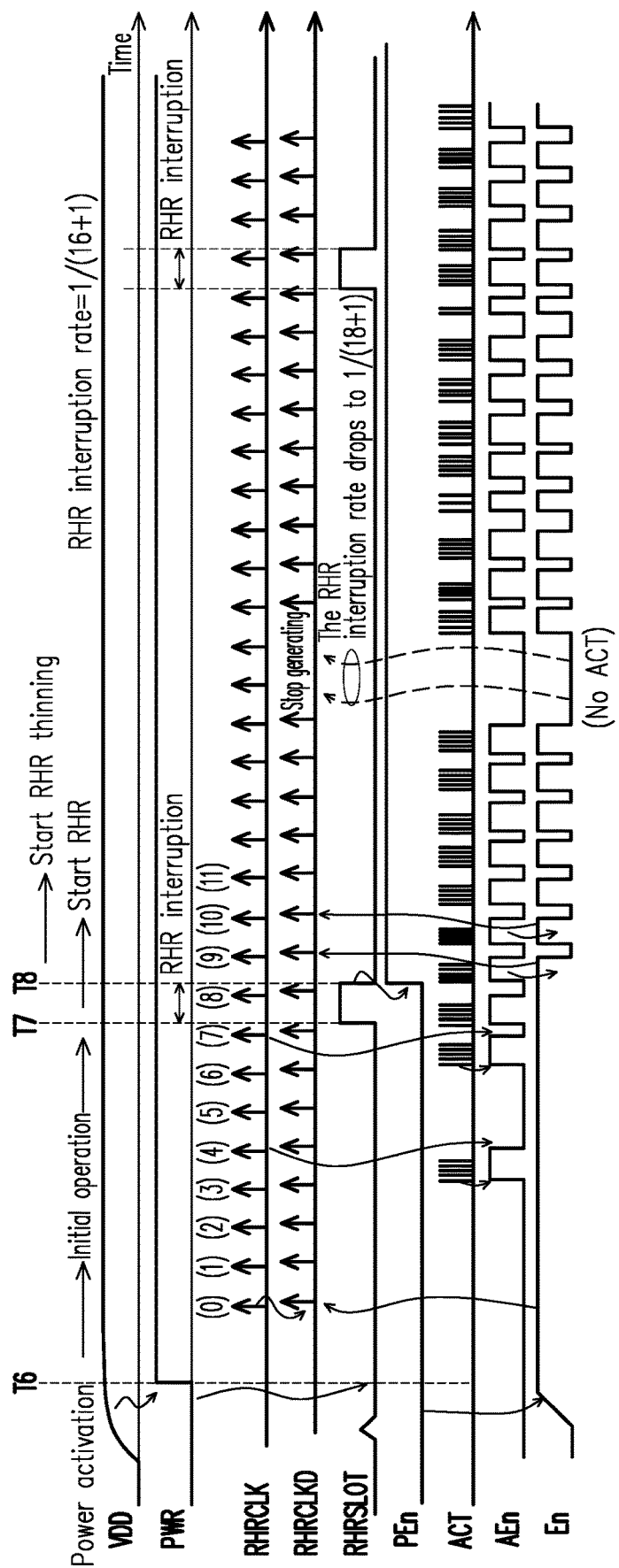
FIG. 13B is an example of an operation waveform of an RHR thinning circuit according to an embodiment of the disclosure.

FIG. 13B is an example of an operation waveform of the RHR thinning circuit 1000 according to an embodiment of the disclosure. Referring to FIG. 13A and FIG. 13B at the same time, the refresh operation of the embodiment is described below.

As shown in FIG. 13B, when the power supply is started (i.e., at a time point T6), the power supply voltage VDD rises. In response to such situation, the signals related to power activation are enabled. For example, when the power supply voltage VDD reaches a predetermined stable potential, the start signal PWR is changed from 0 to 1 (valid). Then, when the start signal PWR is enabled, an initial operation is performed. In the initial operation, even if the active signal ACT is not enabled, the third enable signal En is still locked to 1, and now thinning of the row hammer refresh (RHR) is yet started.

Then, after a time point T7, it is started to generate the second refresh signal RHRSLOT. At a time point T8, the flip-flop 1100 may pull the second enable signal PEn up to 1. In response to such situation, the third enable signal En may not be locked at 1 and it is started to operate in response to the first enable signal AEn. As a result, when the active signal ACT stops being enabled, generation of the third clock RHRCLKD is also stopped, thereby changing an RHR interruption rate (in FIG. 13B, for example, the RHR interruption rate is reduced from 1/(16+1) to 1/(18+1)).

Figure 14:
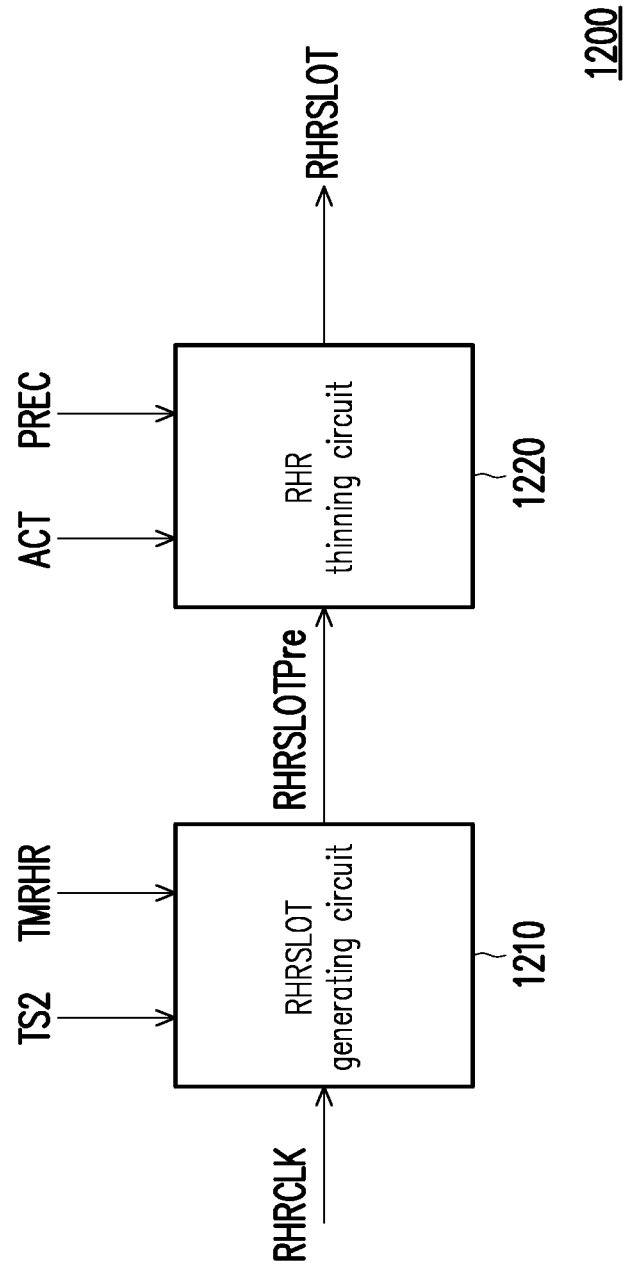
FIG. 14 is a schematic diagram of an RHR state control circuit according to an embodiment of the disclosure.

It should be noted that in an embodiment, in the RHR state control circuit, the RHRSLOT generating circuit may also be used as a first stage. FIG. 14 is a schematic diagram of an RHR state control circuit 1200 according to an embodiment of the disclosure. An RHRSLOT generating circuit 1210 generates a third refresh signal RHRSLOTPre based on the second clock RHRCLK, and adjusts an output interval of the third refresh signal RHRSLOTPre according to the temperature signal TS2 and the second refresh setting information TMRHR.

An RHR thinning circuit 1220 is coupled to the RHRSLOT generating circuit 1210. The RHR thinning circuit 1220 generates the second refresh signal RHRSLOT according to the third refresh signal RHRSLOTPre, the active signal ACT of the corresponding memory block, and the pre-charge signal PREC. It should be noted that the pre-charge signal PREC is, for example, a pulse signal generated when a bit line is about to be pre-charged. When the control signal generator receives a pre-charge command, it may generate the pre-charge signal PREC.

Figure 15A:
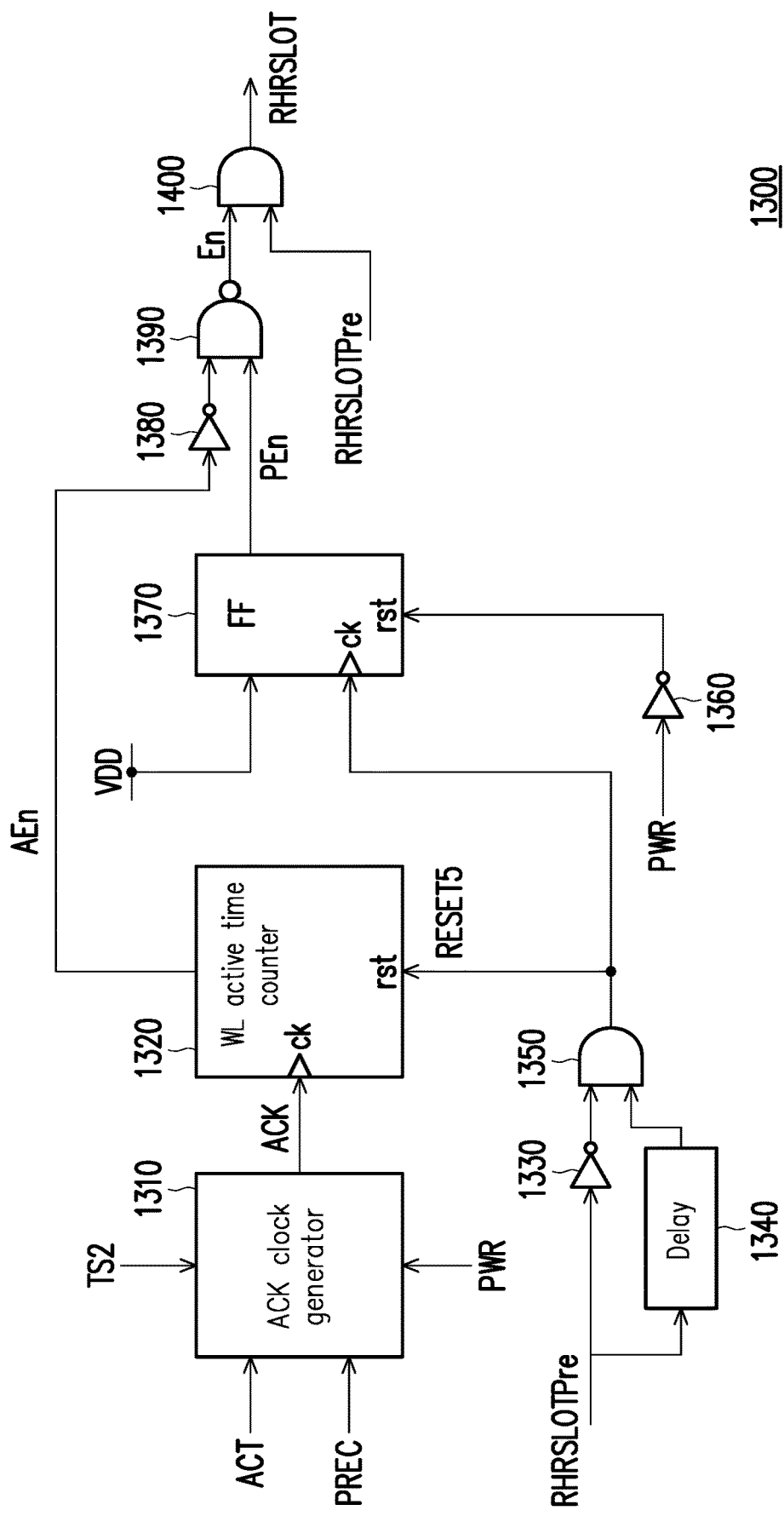
FIG. 15A is a schematic diagram of an RHR thinning circuit according to an embodiment of the disclosure.

An internal structure of the RHR thinning circuit is further described blow. FIG. 15A is a schematic diagram of an RHR thinning circuit 1300 according to an embodiment of the disclosure. The structure of the RHR thinning circuit 1300 may be applied to the RHR thinning circuit 1220 of FIG. 14.

An ACK clock generator 1310 may generate an execution signal ACK according to the active signal ACT, the pre-charge signal PREC, the temperature signal TS2, and the start signal PWR. A WL active time counter 1320 is coupled to the ACK clock generator 1310. The WL active time counter 1320 counts the execution signal ACK to generate the first enable signal AEn, and is controlled by a reset signal RESET5 to re-count.

An input terminal of an inverter 1330 is coupled to the third refresh signal RHRSLOTPre. An input terminal of a delay circuit 1340 is coupled to the third refresh signal RHRSLOTPre. A first input terminal of an AND gate 1350 is coupled to an output terminal of the inverter 1330, a second input terminal of the AND gate 1350 is coupled to an output terminal of the delay circuit 1340, and an output terminal of the AND gate 1350 generates the reset signal RESET5.

An input terminal of an inverter 1360 is coupled to the start signal PWR. A first control terminal of a flip-flop 1370 is coupled to the reset signal RESET5, and a second control terminal of the flip-flop 1370 is coupled to an output terminal of the inverter 1360. An output terminal of the flip-flop 1370 is adapted to provide the second enable signal PEn.

An input terminal of an inverter 1380 is coupled to an output terminal of the WL active time counter 1320 to receive the first enable signal AEn. A first input terminal of a NAND gate 1390 is coupled to an output terminal of the inverter 1380, and a second input terminal of the NAND gate 1390 is coupled to the output terminal of the flip-flop 1370 to receive the second enable signal PEn. An output terminal of the NAND gate 1390 is adapted to provide the third enable signal En. A first input terminal of the AND gate 1400 is coupled to the output terminal of the NAND gate 1390 to receive the third enable signal En, a second input terminal of the AND gate 1400 is coupled to the third refresh signal RHRSLOTPre, and an output terminal of the AND gate 1400 generates the second refresh signal RHRSLOT. According to the circuit configuration shown in FIG. 15A, the function of the RHR thinning circuit is implemented.

Figure 15B:
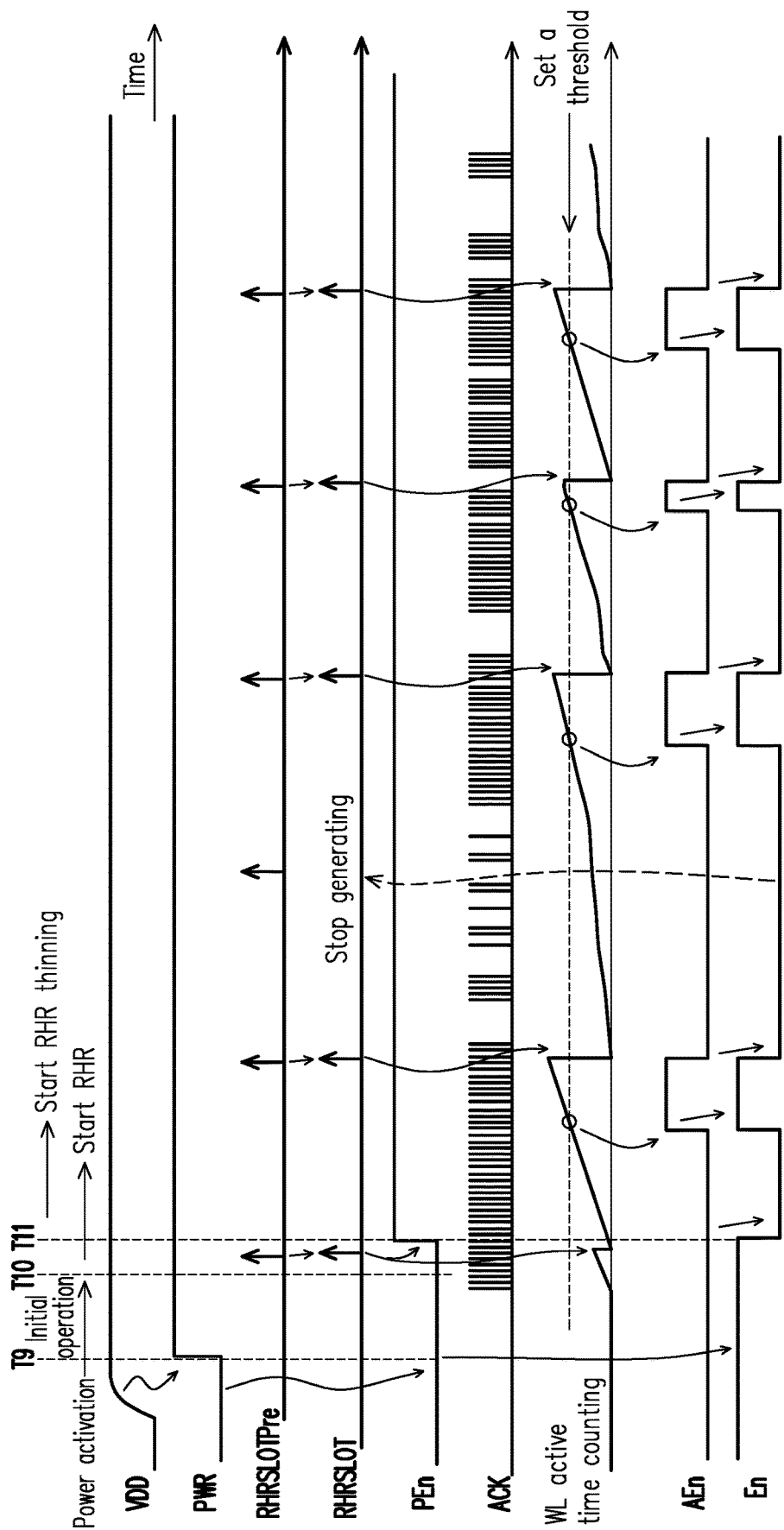
FIG. 15B is an example of an operation waveform of an RHR thinning circuit according to an embodiment of the disclosure.

FIG. 15B is an example of an operation waveform of the RHR thinning circuit 1300 according to an embodiment of the disclosure. Referring to FIG. 15A and FIG. 15B at the same time, the refresh operation of the embodiment is described below.

As shown in FIG. 15B, when the power is turned on (i.e., at a time point T9), the power supply voltage VDD rises. In response to such situation, the signals related to power activation are enabled. For example, when the power supply voltage VDD reaches a predetermined stable potential, the start signal PWR is changed from 0 to 1 (valid). Then, when the start signal PWR is enabled, an initial operation is performed. In the initial operation, even if the active signal ACT is not enabled, the third enable signal En is still locked to 1, and now thinning of the row hammer refresh (RHR) is yet started.

Then, after a time point T10, it is started to receive the third refresh signal RHRSLOTPre. At a time point T11, the flip-flop 1370 may pull the second enable signal PEn up to 1. In response to such situation, the third enable signal En may not be locked at 1 and it is started to operate in response to the first enable signal AEn. In this way, when the count of the execution signal ACK counted by the WL active time counter 1320 has not reached a setting threshold, even if the third refresh signal RHRSLOTPre is received, generation of the second refresh signal RHRSLOT is also stopped.

Figure 16A:
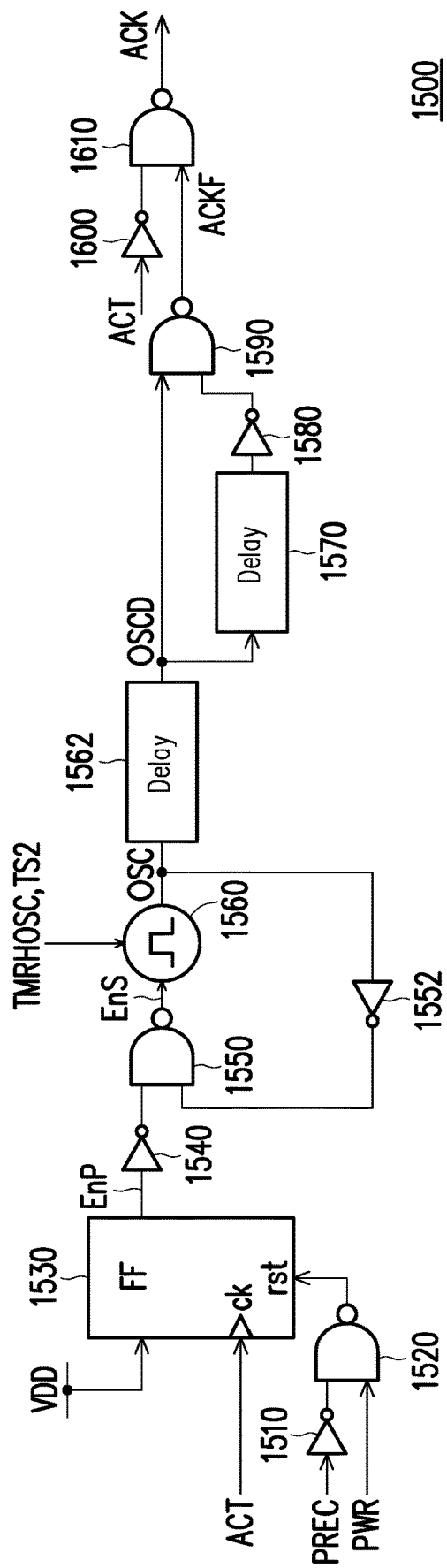
FIG. 16A is a schematic diagram of an ACK clock generator according to an embodiment of the disclosure.

An internal structure of the ACK clock generator is further described below. FIG. 16A is a schematic diagram of an ACK clock generator 1500 according to an embodiment of the disclosure. The structure of the ACK clock generator 1500 may be applied to the ACK clock generator 1310 of FIG. 15A.

An input terminal of an inverter 1510 is coupled to the pre-charge signal PREC. A first input terminal of a NAND gate 1520 is coupled to an output terminal of the inverter 1510, and a second input terminal of the NAND gate 1520 is coupled to the start signal PWR. A first control terminal of a flip-flop 1530 is coupled to the active signal ACT, and a second control terminal of the flip-flop 1530 is coupled to an output terminal of the NAND gate 1520. An output terminal of the flip-flop 1530 is adapted to provide a fourth enable signal EnP.

An input terminal of an inverter 1540 is coupled to the output terminal of the flip-flop 1530 to receive the fourth enable signal EnP. A first input terminal of a NAND gate 1550 is coupled to an output terminal of the inverter 1540, and a second input terminal of the NAND gate 1550 is coupled to an output terminal of an inverter 1552. An output terminal of the NAND gate 1550 is adapted to provide a fifth enable signal EnS. An input terminal of an oscillator 1560 is coupled to the output terminal of the NAND gate 1550 to receive the fifth enable signal EnS, a control terminal of the oscillator 1560 is coupled to the temperature signal TS2 and oscillation information TMRHOSC, and an output terminal of the oscillator 1560 generates an oscillation signal OSC, and is coupled to an input terminal of the inverter 1552 and an input terminal of a delay circuit 1562. An output terminal of the delay circuit 1562 is adapted to provide the oscillation signal OSCD.

An input terminal of the delay circuit 1570 is coupled to the output terminal of the delay circuit 1562 to receive the oscillation signal OSCD. An input terminal of an inverter 1580 is coupled to an output terminal of the delay circuit 1570. A first input terminal of a NAND gate 1590 is coupled to the oscillation signal OSCD, a second input terminal of the NAND gate 1590 is coupled to an output terminal of the inverter 1580, and an output terminal of the NAND gate 1590 may generate an execution signal ACKF.

An input terminal of an inverter 1600 is coupled to the active signal ACT. A first input terminal of a NAND gate 1610 is coupled to an output terminal of the inverter 1600, a second input terminal of the NAND gate 1610 is coupled to the output terminal of the NAND gate 1590 to receive the execution signal ACKF, and an output terminal of the NAND gate 1610 may generate the execution signal ACK.

Figure 16B:
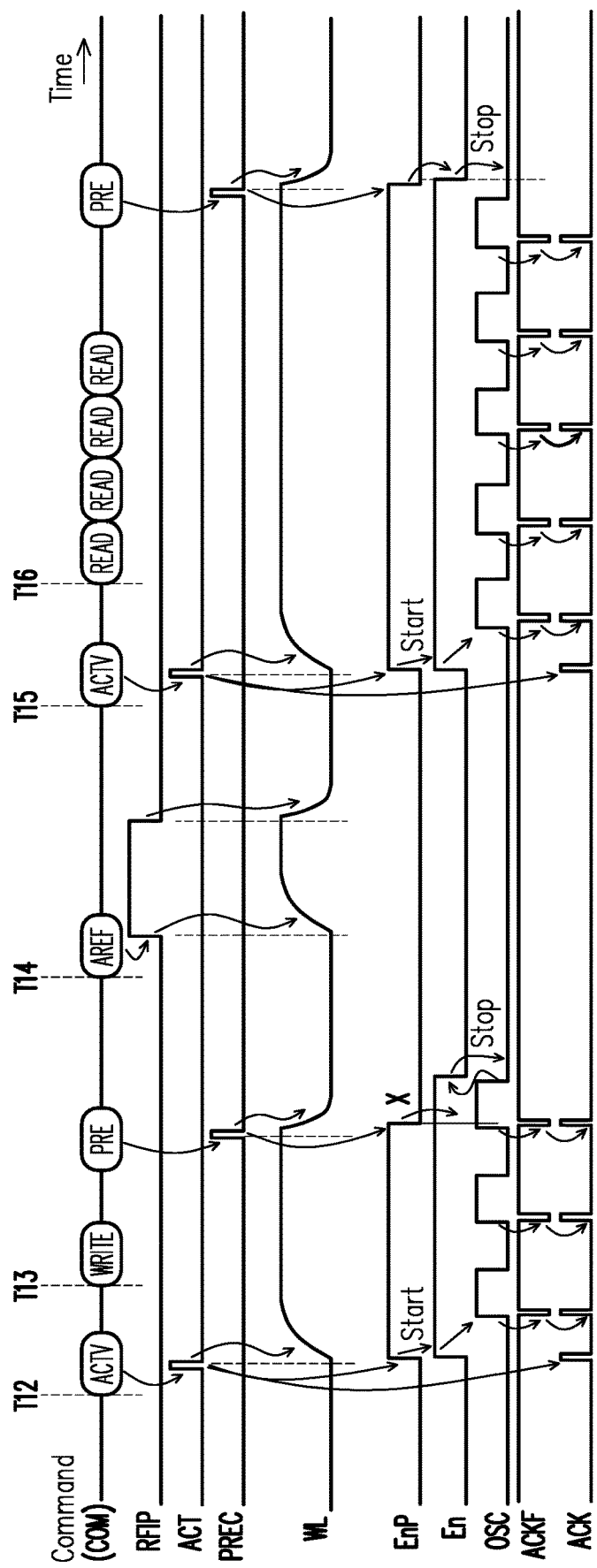
FIG. 16B is an example of an operation waveform of an ACK clock generator according to an embodiment of the disclosure.

FIG. 16B is an example of an operation waveform of the ACK clock generator 1500 according to an embodiment of the disclosure. Referring to FIG. 16A and FIG. 16B at the same time, the operation of the embodiment is described below.

As shown in FIG. 16B, when the command signal COM indicating activation is received at a time point T12, and the command signal COM indicating a write operation is received at a time point T13, the flip-flop 1530 may receive the active signal ACT. Based on the circuit configuration shown in FIG. 16A, the oscillator 1560 generates the oscillation signal OSC, and the NAND gate 1610 generates the corresponding execution signal ACK.

Comparatively, as shown in FIG. 16B, in the case that the command signal COM indicating automatic refresh is received at a time point T14, the flip-flop 1530 does not receive the active signal ACT. In this way, the oscillator 1560 does not generate the oscillation signal OSC, and the NAND gate 1610 does not generate the execution signal ACK.

In addition, as shown in FIG. 16B, when the command signal COM indicating activation is received at a time point T15 and the command signal COM indicating a read operation is received at a time point T16, the flip-flop 1530 may also receive the active signal ACT. Based on the circuit configuration shown in FIG. 16A, the oscillator 1560 may generate the oscillation signal OSC, and the NAND gate 1610 generates the corresponding execution signal ACK.

In summary, the semiconductor memory apparatus of the disclosure may respectively generate a signal (a first refresh signal) used for performing a CBR refresh operation and a signal (a second refresh signal) used for performing a row hammer refresh operation based on the refresh operation signal. Moreover, in the disclosure, under the premise that necessary and sufficient refresh opportunities are provided in all temperature ranges, the execution cycles of CBR refresh (a first refresh) and row hammer refresh (a second refresh) are appropriately thinned and adjusted. In this way, the data retention capability is ensured, and power consumption is reduced.

What is claimed is:

1. A semiconductor memory apparatus, comprising:
   a temperature sensor, configured to detect a device temperature inside the semiconductor memory apparatus to generate a corresponding temperature signal;
   a plurality of memory blocks, each of the memory blocks comprising a memory cell array having a plurality of volatile memory cells and a plurality of word lines, wherein the word lines are respectively connected to the volatile memory cells;
   a refresh controller, coupled to the temperature sensor and the memory blocks, monitoring accesses to the word lines, detecting accesses that occur a predetermined number of times within a predetermined period, and assigning a refresh operation corresponding to a refresh operation command to a first refresh operation or a second refresh operation; and
   a mode register and OTP block, coupled to the refresh controller, and generating first refresh setting information and second refresh setting information according to a mode signal,
   wherein the refresh controller respectively outputs a first refresh signal and a second refresh signal based on a refresh operation signal, adjusts an output interval of the first refresh signal according to the first refresh setting information and the temperature signal, and adjusts an output interval of the second refresh signal according to the second refresh setting information and the temperature signal,
   the memory blocks perform the first refresh operation in response to the first refresh signal, and perform the second refresh operation in response to the second refresh signal,
   the refresh controller generates a CBR refresh address according to the first refresh signal and the second refresh signal, and when the first refresh signal and the second refresh signal are output at the same time, each of the memory blocks performs one of the first refresh operation and the second refresh operation,
   wherein the refresh controller comprises:
   a CBR thinning circuit, outputting the first refresh signal based on a first clock, and adjusting an output interval of the first refresh signal according to the temperature signal, the first refresh setting information, and the CBR refresh address;
   an RHR state control circuit, coupled to the CBR thinning circuit, outputting the second refresh signal based on a second clock, and adjusting an output interval of the second refresh signal according to the temperature signal and the second refresh setting information; and
   a CBR counter, coupled to the CBR thinning circuit and the RHR state control circuit, and counting a number of times of executions of the first refresh operation according to a first counting signal to generate the CBR refresh address.

2. The semiconductor memory apparatus as claimed in claim 1, wherein the first refresh operation is thinned and activated based on information of the device temperature, the second refresh operation is thinned and activated based on information of an amount of accesses to the word lines, and when the first refresh operation and the second refresh operation are in a same cycle and it is unable to perform two internal refreshes in the same cycle, the refresh controller is adapted to control execution of one refresh operation in the cycle and transfer an unexecuted refresh operation to a next cycle to execute.

3. The semiconductor memory apparatus as claimed in claim 1, wherein the first refresh operation is a refresh operation configured to perform a CBR refresh, and the second refresh operation is a refresh operation configured to perform a row hammer refresh.

4. The semiconductor memory apparatus as claimed in claim 1, further comprising:
   a first address multiplexer, coupled to the refresh controller and the memory blocks, receiving a data address and the CBR refresh address, and selecting the data address or the CBR refresh address as a first row address according to the refresh operation signal.

5. The semiconductor memory apparatus as claimed in claim 4, wherein each of the memory blocks comprises:
   an AND gate, having a first input terminal coupled to the refresh operation signal, a second input terminal coupled to the second refresh signal, and an output terminal generating a row hammer signal;

an RHA detection circuit, coupled to the output terminal of the AND gate, and generating a row hammer refresh address according to an active signal, the row hammer signal, and a second row address;

a second address multiplexer, having a first input terminal coupled to the first row address, and a second input terminal coupled to the row hammer refresh address, and selecting the first row address or the row hammer refresh address to output as the second row address according to the row hammer signal; and a row decoder and memory block control, coupled to the RHA detection circuit and the second address multiplexer, and latching the second row address as a block access address for output according to the active signal.

6. The semiconductor memory apparatus as claimed in claim 1, wherein the refresh controller further comprises:

a buffer gate, having an input terminal coupled to the refresh operation signal, and an output terminal generating the first clock;

a first AND gate, having a first input terminal coupled to the output terminal of the buffer gate, a second input terminal coupled to the first refresh signal, and an output terminal generating a second counting signal;

a multiplexer, having a first terminal coupled to the refresh operation signal, a second terminal coupled to the second counting signal, and selecting the refresh operation signal or the second counting signal to output as the second clock according to a mode switching signal;

an inverter, having an input terminal coupled to the second refresh signal; and a second AND gate, having a first input terminal coupled to an output terminal of the inverter, a second input terminal coupled to the second counting signal, and an output terminal outputting the first counting signal to the CBR counter.

7. The semiconductor memory apparatus as claimed in claim 1, wherein the refresh controller further comprises:

a buffer gate, having an input terminal coupled to the refresh operation signal, and an output terminal generating the second clock;

a first AND gate, having a first input terminal coupled to the refresh operation signal, and an output terminal generating the first clock;

a second AND gate, having a first input terminal coupled to the first clock, a second input terminal coupled to the first refresh signal, and an output terminal generating the first counting signal; and a NAND gate, having a first input terminal coupled to the second refresh signal, a second input terminal coupled to the first refresh signal, and an output terminal coupled to a second input terminal of the first AND gate.

8. The semiconductor memory apparatus as claimed in claim 1, wherein the RHR state control circuit comprises:

an RHR thinning circuit, generating a third clock according to the second clock, the second refresh signal, and an active signal; and a RHRSLOT generating circuit, coupled to the RHR thinning circuit, generating the second refresh signal based on the third clock, and adjusting an output interval of the second refresh signal according to the temperature signal and the second refresh setting information.

9. The semiconductor memory apparatus as claimed in claim 1, wherein the CBR thinning circuit comprises:

a cycle counter, counting the first clock to generate a counting value, and controlled by a first reset signal to re-count;

a setting signal generator, coupled to the cycle counter, determining a first setting value according to the temperature signal and the first refresh setting information, and generating a setting signal when the counting value is changed from the first setting value to another value;

a reset signal generator, coupled to the cycle counter, determining a second setting value according to the temperature signal and the first refresh setting information, and generating a second reset signal when the counting value is changed from the second setting value to another value;

a first inverter, having an input terminal coupled to the second reset signal;

a first NAND gate, having a first input terminal coupled to an output terminal of the first inverter, a second input terminal coupled to a start signal, and an output terminal generating the first reset signal;

a flip-flop, coupled to the setting signal generator and the first NAND gate, and changing a logic level of an output terminal according to the setting signal and the first reset signal; and a second inverter, having an input terminal coupled to the output terminal of the flip-flop, and an output terminal generating the first refresh signal.

10. The semiconductor memory apparatus as claimed in claim 8, wherein the RHRSLOT generating circuit comprises:

a cycle counter, counting the third clock to generate a counting value, and controlled by a first reset signal to re-count;

a setting signal generator, coupled to the cycle counter, determining a first setting value according to the temperature signal and the second refresh setting information, and generating a setting signal when the counting value is changed from the first setting value to another value;

a reset signal generator, coupled to the cycle counter, determining a second setting value according to the temperature signal and the second refresh setting information, and generating a second reset signal when the counting value is changed from the second setting value to another value;

a first inverter, having an input terminal coupled to the second reset signal;

a second NAND gate, having a first input terminal coupled to an output terminal of the first inverter, a second input terminal coupled to a start signal, and an output terminal generating the first reset signal;

a flip-flop, coupled to the setting signal generator and the second NAND gate, and changing a logic level of an output terminal according to the setting signal and the first reset signal; and a second buffer gate, having an input terminal coupled to the output terminal of the flip-flop, and an output terminal generating the second refresh signal.

11. The semiconductor memory apparatus as claimed in claim 8, wherein the RHR thinning circuit comprises:

a first delay circuit, having an input terminal coupled to the second clock;

a first inverter, having an input terminal coupled to an output terminal of the first delay circuit;

a second NAND gate, having a first input terminal coupled to an output terminal of the first inverter, and a second input terminal coupled to a start signal;

a first flip-flop, having a first control terminal coupled to the active signal, and a second control terminal coupled to an output terminal of the second NAND gate;

a second inverter, having an input terminal coupled to the second refresh signal;

a second delay circuit, having an input terminal coupled to the second refresh signal;

a third AND gate, having a first input terminal coupled to an output terminal of the second inverter, and a second input terminal coupled to an output terminal of the second delay circuit;

a third inverter, having an input terminal coupled to the start signal;

a second flip-flop, having a first control terminal coupled to an output terminal of the third AND gate, and a second control terminal coupled to an output terminal of the third inverter;

a fourth inverter, having an input terminal coupled to an output terminal of the first flip-flop;

a third NAND gate, having a first input terminal coupled to an output terminal of the fourth inverter, and a second input terminal coupled to the output terminal of the second inverter; and a fourth AND gate, having a first input terminal coupled to an output terminal of the third NAND gate, a second input terminal coupled to the second clock, and an output terminal generating the third clock.

12. The semiconductor memory apparatus as claimed in claim 1, further comprising:
a command decoder, coupled to the refresh controller, starting to generate a refresh operation signal when receiving the refresh operation command.

13. A semiconductor memory apparatus, comprising:
a temperature sensor, configured to detect a device temperature inside the semiconductor memory apparatus to generate a corresponding temperature signal;
a plurality of memory blocks, coupled to the temperature sensor, each of the memory blocks comprising a refresh controller, a memory cell array having a plurality of volatile memory cells and a plurality of word lines, wherein the word lines are respectively connected to the volatile memory cells,
wherein the refresh controller monitors accesses corresponding to the word lines, detects accesses that occur a predetermined number of times within a predetermined period, and assigns a refresh operation corresponding to a refresh operation command to a first refresh operation or a second refresh operation,
the semiconductor memory apparatus further comprises:
a mode register and OTP block, coupled to the refresh controllers, and generating first refresh setting information and second refresh setting information according to a mode signal,
wherein each of the refresh controllers respectively outputs a first refresh signal and a second refresh signal based on a refresh operation signal, adjusts an output interval of the first refresh signal according to the first refresh setting information and the temperature signal, and adjusts an output interval of the second refresh signal according to the second refresh setting information and the temperature signal,
each of the memory blocks performs the first refresh operation in response to the corresponding first refresh signal, and performs the second refresh operation in response to the corresponding second refresh signal,
each of the refresh controllers generates a CBR refresh address according to the corresponding first refresh signal and the second refresh signal, and when the first refresh signal and the second refresh signal are output at the same time, the corresponding memory block performs one of the first refresh operation and the second refresh operation,
wherein each of the refresh controllers comprises:
a CBR thinning circuit, outputting the first refresh signal based on a first clock, and adjusting an output interval of the first refresh signal according to the temperature signal, the first refresh setting information, and the CBR refresh address;
an RHR state control circuit, coupled to the CBR thinning circuit, outputting the second refresh signal based on a second clock, and adjusting an output interval of the second refresh signal according to the temperature signal and the second refresh setting information; and
a CBR counter, coupled to the CBR thinning circuit and the RHR state control circuit, and counting a number of times of executions of the first refresh operation according to a first counting signal to generate the CBR refresh address.

14. The semiconductor memory apparatus as claimed in claim 13, wherein each of the memory blocks comprises:
a first AND gate, having a first input terminal coupled to the refresh operation signal, a second input terminal coupled to the second refresh signal, and an output terminal generating a row hammer signal;
an RHA detection circuit, coupled to the output terminal of the first AND gate, and generating a row hammer refresh address according to an active signal, the row hammer signal, and a row address;
an inverter, having an input terminal coupled to the second refresh signal;
a second AND gate, having a first input terminal coupled to the refresh operation signal, a second input terminal coupled to the first refresh signal, a third input terminal coupled to an output terminal of the inverter, and an output terminal generating a selection signal;
an address multiplexer, having a first input terminal coupled to the CBR refresh address, a second input terminal coupled to a data address, a third input terminal coupled to the row hammer refresh address, and selecting one of the CBR refresh address, the data address, and the row hammer refresh address to output as the row address according to the row hammer signal and the selection signal; and
a row decoder and memory block control, coupled to the RHA detection circuit and the address multiplexer, and latching the row address according to the active signal to output as a block access address.

15. The semiconductor memory apparatus as claimed in claim 13, wherein the RHR state control circuit comprises:
a RHRSLOT generating circuit, generating a third refresh signal based on the second clock, and adjusting an output interval of the third refresh signal according to the temperature signal and the second refresh setting information; and
an RHR thinning circuit, coupled to the RHRSLOT generating circuit, and generating the second refresh signal according to the third refresh signal, a corresponding active signal, and a pre-charge signal.

16. The semiconductor memory apparatus as claimed in claim 15, wherein the RHR thinning circuit comprises:

an ACK clock generator, generating an execution signal according to the active signal, the pre-charge signal, the temperature signal, and a start signal;

a WL active time counter, coupled to the ACK clock generator, counting the execution signal to generate an execution enable signal, and controlled by a reset signal to re-count;

a first inverter, having an input terminal coupled to the third refresh signal;

a delay circuit, having an input terminal coupled to the third refresh signal;

a third AND gate, having a first input terminal coupled to an output terminal of the first inverter, a second input terminal coupled to an output terminal of the delay circuit, and an output terminal generating the reset signal;

a second inverter, having an input terminal coupled to the start signal;

a flip-flop, having a first control terminal coupled to the reset signal, and a second control terminal coupled to an output terminal of the second inverter;

a third inverter, having an input terminal coupled to the execution enable signal;

a second NAND gate, having a first input terminal coupled to an output terminal of the third inverter, and a second input terminal coupled to an output terminal of the flip-flop; and a fourth AND gate, having a first input terminal coupled to an output terminal of the second NAND gate, a second input terminal coupled to the third refresh signal, and an output terminal generating the second refresh signal.

\* \* \* \* \*